(12) United States Patent
Sasaki et al.

(10) Patent No.: US 7,915,079 B1
(45) Date of Patent: Mar. 29, 2011

(54) METHOD OF MANUFACTURING LAYERED CHIP PACKAGE

(75) Inventors: Yoshitaka Sasaki, Milpitas, CA (US);
Hiroyuki Ito, Milpitas, CA (US);
Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 12/700,342

(22) Filed: Feb. 4, 2010

(51) Int. Cl.
*H01L 21/00* (2006.01)

(52) U.S. Cl. . 438/107; 257/781; 257/786; 257/E23.194; 257/E23.019; 257/E27.111; 257/E21.505; 257/E23.173; 257/E23.079; 257/E21.569; 257/E21.614; 257/E25.006; 257/E25.013; 257/E21.018; 438/109; 438/113; 438/118; 438/458; 438/612; 438/617

(58) Field of Classification Search .......... None
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 2007/0120243 A1* | 5/2007 | Yanagisawa et al. | 257/686 |
| 2009/0325345 A1* | 12/2009 | Sasaki et al. | 438/109 |

OTHER PUBLICATIONS

Gann, Keith D., "Neo-Stacking Technology," *HDI Magazine*, Dec. 1999, pp. 1-4.

* cited by examiner

*Primary Examiner* — Charles D Garber
*Assistant Examiner* — Yasser A Abdelaziez
(74) *Attorney, Agent, or Firm* — Oliff & Berridge, PLC

(57) ABSTRACT

A layered chip package includes a main body, and wiring disposed on at least one side surface of the main body. The main body includes a plurality of layer portions stacked. In a method of manufacturing the layered chip package, a plurality of structures are initially formed. Each structure includes at least one main-body-forming portion that is to be the main body and that has a pre-wiring surface. Next, the plurality of structures are surrounded with a jig and thereby aligned so that their pre-wiring surfaces face upward. The jig has a top surface that is lower in level than the pre-wiring surfaces. Next, a resin layer covering the jig and the structures is formed using a resin film. Next, the resin layer is polished until the pre-wiring surfaces are exposed. Next, the wiring is formed on the pre-wiring surfaces simultaneously. Next, the main-body-forming portions are separated from each other.

6 Claims, 33 Drawing Sheets

METHOD OF MANUFACTURING LAYERED CHIP PACKAGE

BACKGROUND OF THE INVENTION

1. Field of the Invention

The present invention relates to a method of manufacturing a layered chip package that includes a plurality of semiconductor chips stacked.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing acceleration of the operation of circuits and a reduction in stray capacitance of wiring, as well as the advantage of allowing higher integration.

Major examples of the three-dimensional packaging technology for fabricating a layered chip package include a wire bonding method and a through electrode method. According to the wire bonding method, a plurality of chips are stacked on a substrate, and a plurality of electrodes formed on each chip are connected to external connecting terminals formed on the substrate by wire bonding. According to the through electrode method, a plurality of through electrodes are formed in each of the chips to be stacked and inter-chip wiring is performed through the use of the through electrodes.

The wire bonding method has the problem that it is difficult to reduce the distance between the electrodes so as to avoid contact between wires, and the problem that the high resistances of the wires hinder the acceleration of the operation of circuits.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring formed by the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip each have an end face exposed at a side surface of the neo-chip. Next, a plurality of types of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses the technique of fabricating a stack by the same method as that disclosed in U.S. Pat. No. 5,953,588, and forming wiring on two side surfaces of the stack.

Forming the wiring on the side surfaces of the stack as in the foregoing technique eliminates the problems associated with the wire bonding method and the through electrode method.

The manufacturing methods disclosed in U.S. Pat. No. 5,953,588 and in Keith D. Gann, "Neo-Stacking Technology", HDI Magazine, December 1999 each involve a large number of process steps and this raises the cost for the layered chip package. According to the methods, a plurality of chips cut out from a processed wafer are embedded into the embedding resin, and then a plurality of leads are formed to be connected to each chip to thereby fabricate the neo-wafer. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of conductive lines are formed on the respective side surfaces of the plurality of multilayer modules included in the module stack. The module stack is then separated into individual multilayer modules.

With the multilayer module disclosed in U.S. Pat. No. 7,127,807 B2, it is impossible to increase the proportion of the area occupied by the electronic element in each active layer, and consequently it is difficult to achieve higher integration.

To cope with this, as a method for manufacturing a layered chip package that achieves higher integration and has wiring formed on a side surface of the stack at low cost, the following manufacturing method is conceivable. In the manufacturing method, a plurality of wafers are initially fabricated, each of the wafers including an array of a plurality of pre-semiconductor-chip portions. Each of the pre-semiconductor-chip portions is intended to become a semiconductor chip. The plurality of wafers are then stacked into a wafer stack that includes an array of a plurality of pre-separation main bodies. The plurality of pre-separation main bodies are to be separated from each other later into individual main bodies of layered chip packages. The wafer stack is then cut into a structure that includes at least one portion to be the main body. Next, wiring is formed on the plurality of structures simultaneously.

In the foregoing manufacturing method, the plurality of structures may be aligned using a jig when forming the wiring. In this case, however, there arises the problem that differences in level can develop between the top surface of the jig and the top surfaces of the plurality of structures and between the top surfaces of adjoining structures, so that it is difficult to form the wiring with precision.

OBJECT AND SUMMARY OF THE INVENTION

It is an object of the present invention to provide a method of manufacturing a layered chip package with wiring formed on a side surface of its main body, the method allowing the mass production of such layered chip packages at low cost in a short time and allowing the wiring to be formed with precision.

A layered chip package to be manufactured by a manufacturing method of the present invention includes: a main body having a top surface, a bottom surface, and four side surfaces; and wiring disposed on at least one of the side surfaces of the main body. The main body includes a plurality of layer portions stacked. Each of the plurality of layer portions includes a semiconductor chip. At least one of the plurality of layer portions further includes a plurality of electrodes that are electrically connected to the semiconductor chip and that each have an end face located in the at least one of the side surfaces of the main body on which the wiring is disposed. The wiring is electrically connected to the end faces of the plurality of electrodes. The manufacturing method of the present invention is a method of manufacturing a plurality of such layered chip packages.

The method of manufacturing the layered chip packages of the present invention includes the steps of: forming a plurality of structures each of which includes at least one main-body-forming portion, the main-body-forming portion being intended to be the main body and having a pre-wiring surface on which the wiring is to be formed later; surrounding the plurality of structures with a jig and thereby aligning the structures so that their respective pre-wiring surfaces face upward, the jig having a top surface that is lower in level than the pre-wiring surfaces; forming a resin layer using a resin film, the resin layer covering the jig and the plurality of structures; polishing the resin layer until the pre-wiring surfaces are exposed and thereby flattening the pre-wiring surfaces and a top surface of a portion of the resin layer that remains on the top surface of the jig; forming the wiring on the pre-wiring surfaces of a plurality of main-body-forming portions included in the plurality of structures simultaneously, the step of forming the wiring being performed after the step of flattening; and separating the plurality of main-body-forming portions with the wiring formed on the respective pre-wiring surfaces from each other so as to form the plurality of layered chip packages.

In the method of manufacturing the layered chip packages of the present invention, each of the structures may include a plurality of main-body-forming portions.

In the method of manufacturing the layered chip packages of the present invention, in the case where each of the structures includes a plurality of main-body-forming portions, the step of forming the plurality of structures may include the steps of: fabricating a plurality of substructures each of which includes an array of a plurality of preliminary layer portions, each of the preliminary layer portions being intended to become any one of the layer portions included in the main body, the substructures being intended to be cut later at the position of the boundary between every adjacent preliminary layer portions; fabricating a layered substructure by stacking the plurality of substructures, the layered substructure including an array of a plurality of pre-separation main bodies that are intended to be separated from each other later into individual main bodies; and cutting the layered substructure so as to form the plurality of structures. In this case, each of the plurality of structures may include, as the plurality of main-body-forming portions, a plurality of pre-separation main bodies that are arranged in a direction orthogonal to the direction of stacking of the substructures. Alternatively, each of the structures may include, as the plurality of main-body-forming portions, a plurality of pre-separation main bodies that are arranged in each of the direction of stacking of the substructures and the direction orthogonal thereto.

In the method of manufacturing the layered chip packages of the present invention, the step of aligning the plurality of structures arranges a plurality of assemblies each of which includes the plurality of structures, the assemblies being partitioned from each other by the jig.

According to the method of manufacturing the layered chip packages of the present invention, the wiring is formed simultaneously on the pre-wiring surfaces of a plurality of main-body-forming portions included in the plurality of structures after the step of flattening the pre-wiring surfaces and the top surface of the portion of the resin layer that remains on the top surface of the jig. This allows efficient manufacture of the layered chip packages with the wiring formed on the side surfaces of the respective main bodies. The surfaces including the pre-wiring surfaces are flattened when forming the wiring. Consequently, according to the present invention, it is possible to mass-produce the layered chip packages with the wiring formed on the side surfaces of the respective main bodies at low cost in a short time, and it is also possible to form the wiring with precision.

Other and further objects, features and advantages of the present invention will appear more fully from the following description.

DETAILED DESCRIPTION OF THE PREFERRED EMBODIMENT

Figure 1:
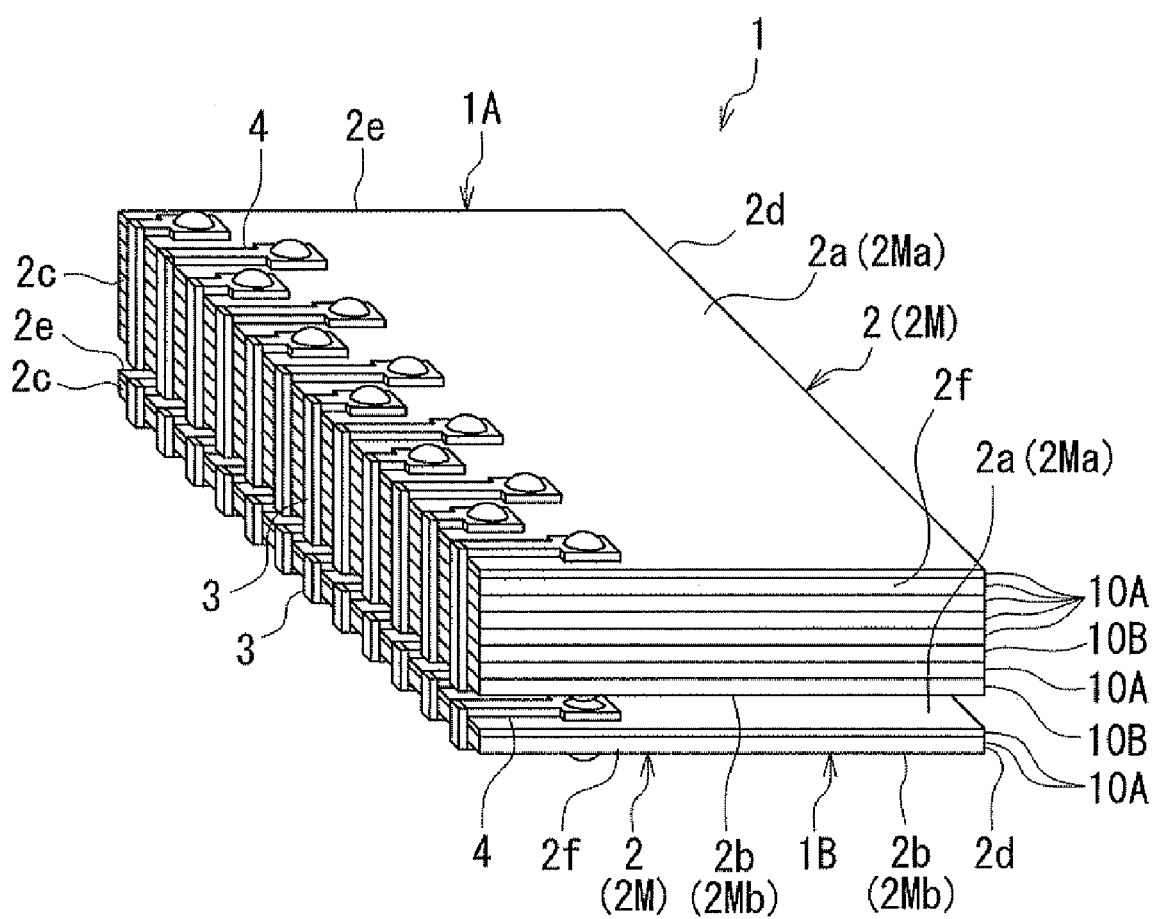
FIG. 1 is a perspective view of a composite layered chip package that includes a layered chip package according to an embodiment of the invention.
Figure 2:
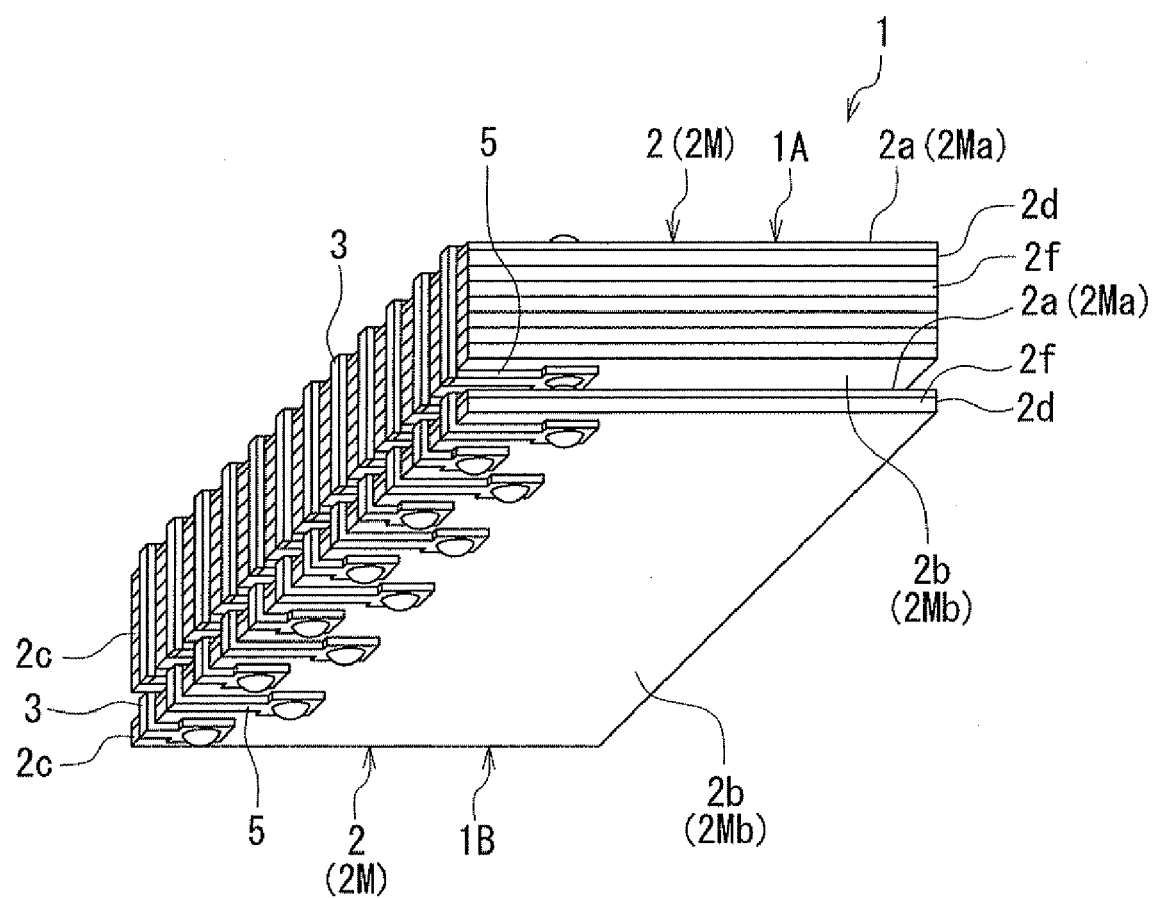
FIG. 2 is a perspective view showing the composite layered chip package of FIG. 1 as viewed from below.
Figure 3:
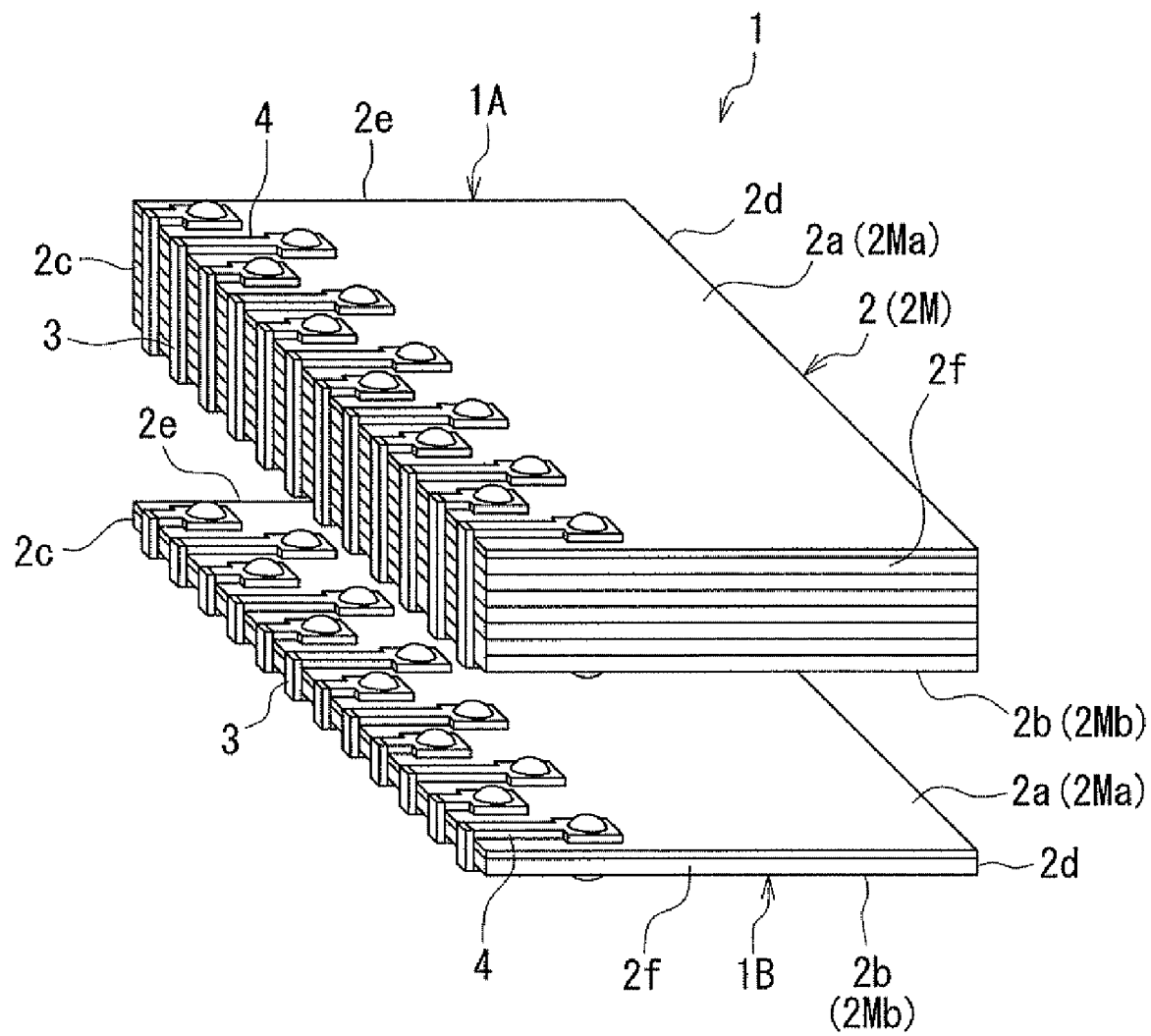
FIG. 3 is an exploded perspective view of the composite layered chip package of FIG. 1.
Figure 4:
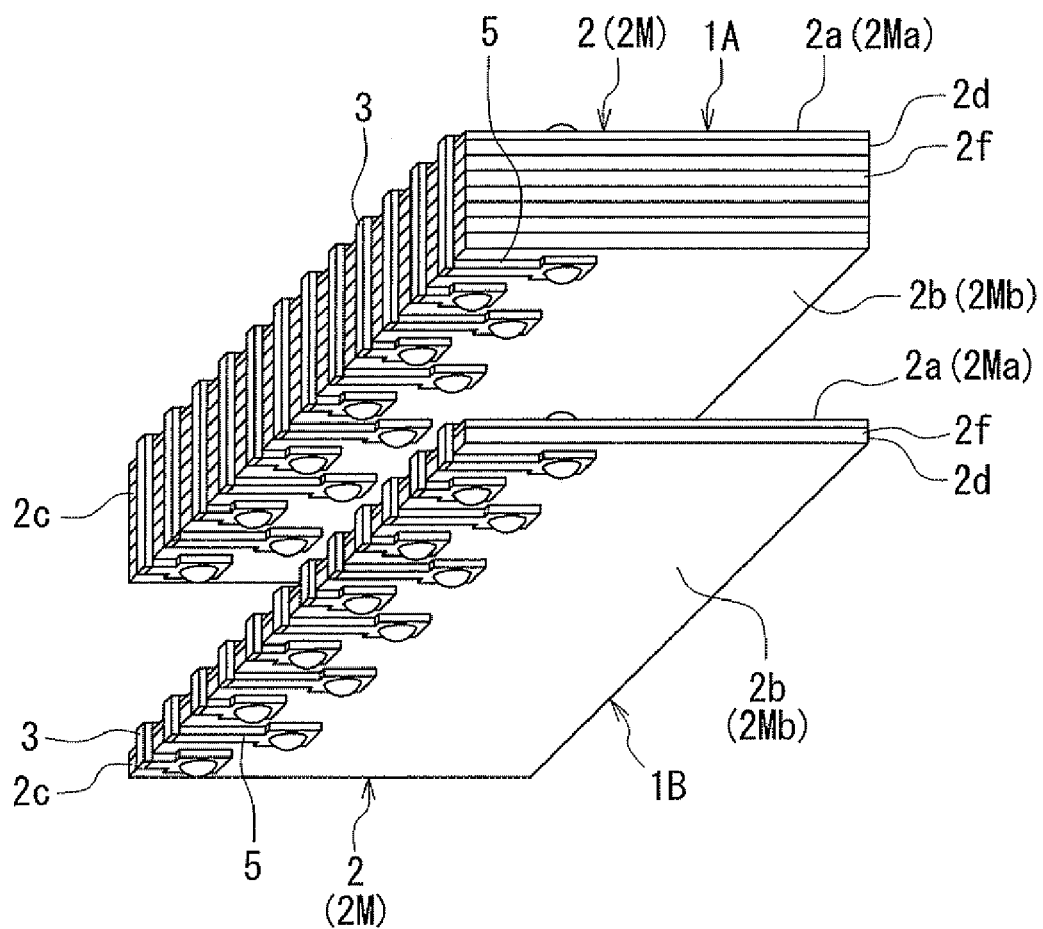
FIG. 4 is an exploded perspective view of the composite layered chip package of FIG. 2.
Figure 5:
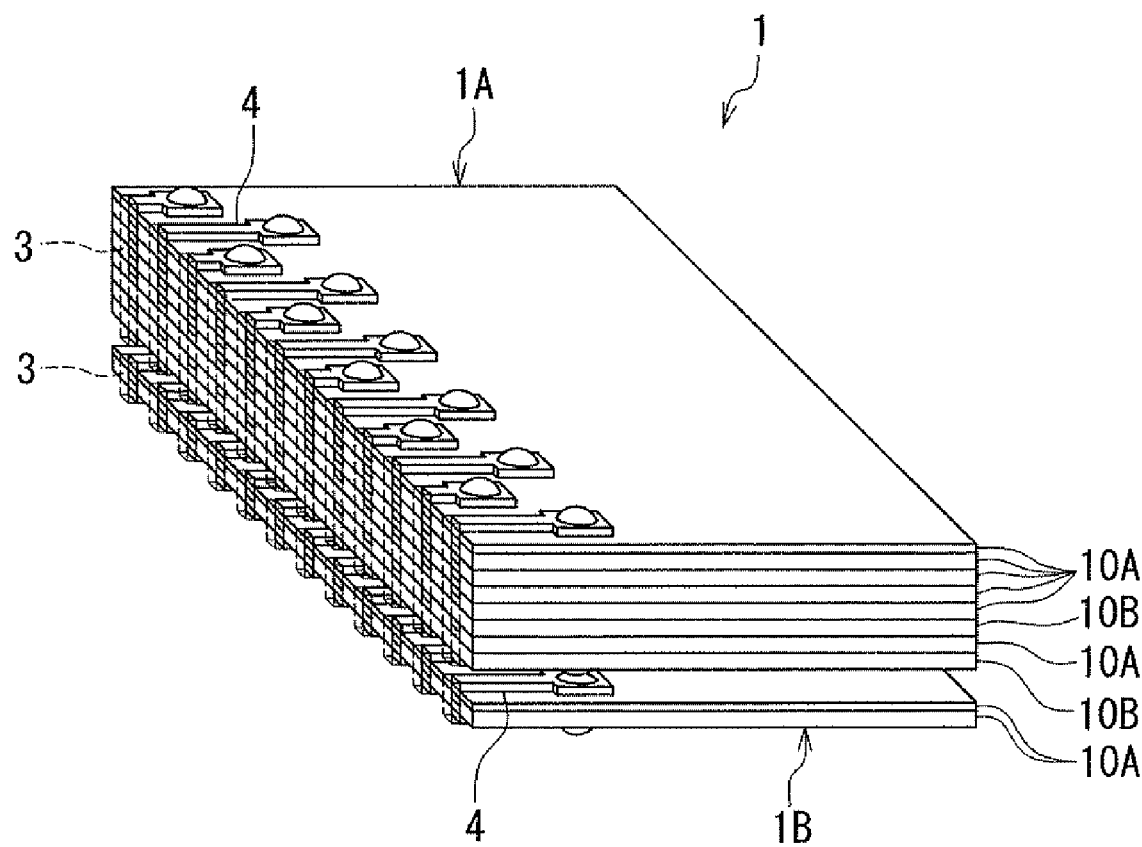
FIG. 5 is a perspective view of the composite layered chip package of FIG. 1 drawn such that respective end faces of a plurality of electrodes are visible.
Figure 6:
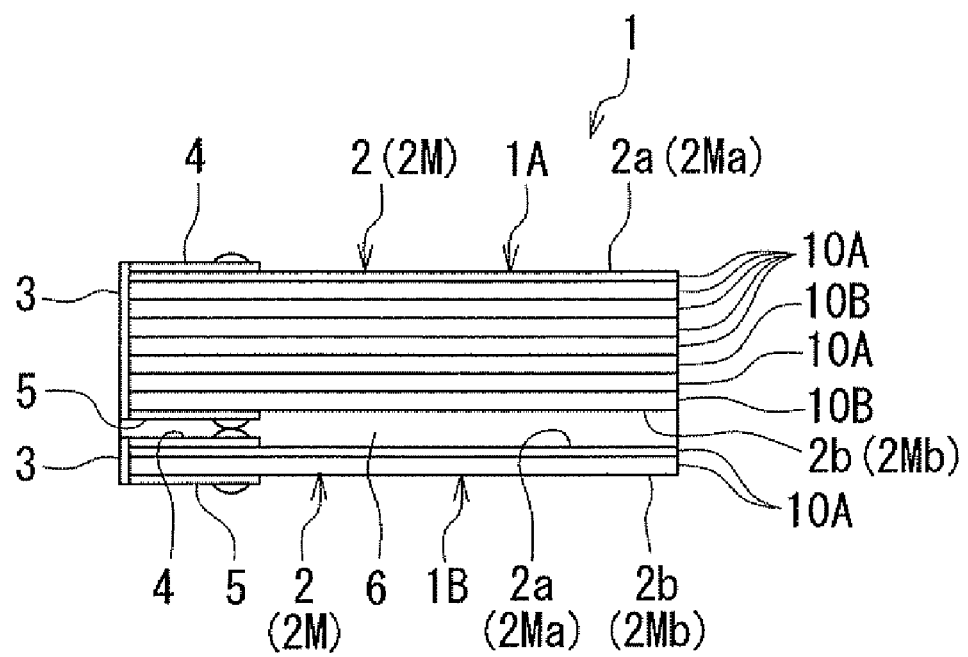
FIG. 6 is a side view of the composite layered chip package of FIG. 1.

A preferred embodiment of the present invention will now be described in detail with reference to the drawings. Reference is first made to FIG. 1 to FIG. 6 to describe the configuration of a composite layered chip package that includes a layered chip package according to the embodiment of the invention. FIG. 1 is a perspective view of the composite layered chip package including the layered chip package according to the embodiment of the invention. FIG. 2 is a perspective view showing the composite layered chip package of FIG. 1 as viewed from below. FIG. 3 is an exploded perspective view of the composite layered chip package of FIG. 1. FIG. 4 is an exploded perspective view of the composite layered chip package of FIG. 2. FIG. 5 is a perspective view of the composite layered chip package of FIG. 1 drawn such that respective end faces of a plurality of electrodes are visible. FIG. 6 is a side view of the composite layered chip package of FIG. 1.

The composite layered chip package 1 shown in FIG. 1 to FIG. 6 includes a plurality of subpackages stacked, every two vertically adjacent subpackages being electrically connected to each other. At least one of the plurality of subpackages is the layered chip package according to the present embodiment. FIG. 1 to FIG. 6 show an example where the composite layered chip package 1 includes two subpackages 1A and 1B, the subpackage 1A being placed on the subpackage 1B. FIG.

3 and FIG. 4 show the state where the subpackages 1A and 1B are separated from each other. In the following description, any subpackage will be generally designated by reference numeral 1S. In the example shown in FIG. 1 to FIG. 6, each of the subpackages 1A and 1B is the layered chip package according to the present embodiment.

Each of the subpackages 1A and 1B includes a main body 2 having a top surface 2a, a bottom surface 2b, and four side surfaces 2c, 2d, 2e and 2f. The side surfaces 2c and 2d face toward opposite directions. The side surfaces 2e and 2f face toward opposite directions. Each of the subpackages 1A and 1B further includes wiring 3 disposed on at least one of the side surfaces of the main body 2. In the example shown in FIG. 1 to FIG. 6, the wiring 3 is disposed on the side surface 2c of the main body 2. The main body 2 has a main part 2M that includes at least one first-type layer portion 10A. The main part 2M has a top surface 2Ma and a bottom surface 2Mb.

The main body 2 of the lower subpackage 1B further has a plurality of first terminals 4 that are disposed on the top surface 2Ma of the main part 2M and electrically connected to the wiring 3. The main body 2 of the upper subpackage 1A further has a plurality of second terminals 5 that are disposed on the bottom surface 2Mb of the main part 2M and electrically connected to the wiring 3. The plurality of second terminals 5 of the main body 2 of the upper subpackage 1A are electrically connected to the plurality of first terminals 4 of the main body 2 of the lower subpackage 1B.

As shown in FIG. 6, the composite layered chip package 1 may include a sealing part 6 that is made of an insulating material and fills the gap between the subpackages 1A and 1B.

If the composite layered chip package 1 includes three or more subpackages 1S stacked, any two vertically adjacent subpackage 1S shall be configured as follows. The main body 2 of the lower subpackage 1S has the plurality of first terminals 4; the main body 2 of the upper subpackage 1S has the plurality of second terminals 5; and the second terminals 5 of the main body 2 of the upper subpackage 1S are electrically connected to the first terminals 4 of the main body 2 of the lower subpackage 1S.

In the present embodiment, the main body 2 of the lowermost subpackage 1S may further have the plurality of second terminals 5, and the main body 2 of the uppermost subpackage 1S may further have the plurality of first terminals 4. The respective main bodies 2 of all of the plurality of subpackages 1S may each have the plurality of first terminals 4 and the plurality of second terminals 5. In the example shown in FIG. 1 to FIG. 6, the main bodies 2 of both of the subpackages 1A and 1B each have the plurality of first terminals 4 and the plurality of second terminals 5. Consequently, in this case, the main body 2 of the lowermost subpackage 1B has the plurality of second terminals 5, and the main body 2 of the uppermost subpackage 1A has the plurality of first terminals 4.

Each of the terminals 4 and 5 may include a bump formed of solder, for example. In this case, the terminals 4 and 5 are electrically connected to each other by bonding the bump of the terminal 4 and the bump of the terminal 5 to each other.

The main part 2M of the main body 2 of at least one of the plurality of subpackages 1S further includes at least one second-type layer portion 10B. As will be described in detail later, each of the first-type layer portion 10A and the second-type layer portion 10B includes a semiconductor chip. The first-type layer portion 10A further includes a plurality of electrodes that are each electrically connected to the semiconductor chip and that each have an end face located in the at least one of the side surfaces of the main body 2 on which the wiring 3 is disposed, whereas the second-type layer portion 10B does not include any electrodes that each have an end face located in the at least one of the side surfaces of the main body 2 on which the wiring 3 is disposed. The wiring 3 is electrically connected to the end faces of the plurality of electrodes. The semiconductor chip of the first-type layer portion 10A is a normally functioning one whereas the semiconductor chip of the second-type layer portion 10B is a malfunctioning one.

In the example shown in FIG. 1 to FIG. 6, the main part 2M of the main body 2 of the subpackage 1A includes six first-type layer portions 10A and two second-type layer portions 10B, whereas the main part 2M of the main body 2 of the subpackage 1B includes two first-type layer portions 10A and no second-type layer portion 10B.

When the main part 2M of the main body 2 includes a plurality of layer portions regardless of the types of the layer portions, the plurality of layer portions are stacked on each other between the top surface 2Ma and the bottom surface 2Mb of the main part 2M. Every two vertically adjacent layer portions are bonded to each other with an adhesive, for example. Hereinafter, any layer portion will be generally designated by reference numeral 10.

With a plurality of layer portions 10 included in the main part 2M of its main body 2, a subpackage 1S itself is the layered chip package according to the present embodiment.

Figure 7:
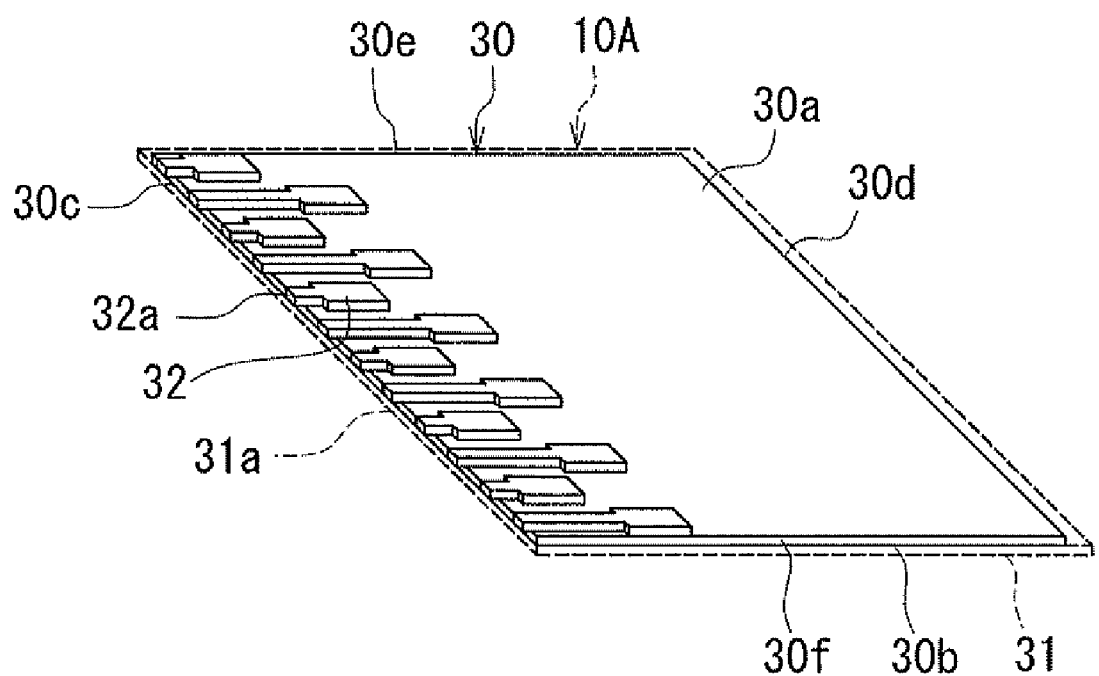
FIG. 7 is a perspective view showing a layer portion included in the composite layered chip package of FIG. 1.

FIG. 7 is a perspective view showing a part of the first-type layer portion 10A. As shown in FIG. 7, the layer portion 10A includes a semiconductor chip 30. The semiconductor chip 30 has: a first surface 30a with a device formed thereon; a second surface 30b opposite to the first surface 30a; a first side surface 30c and a second side surface 30d that face toward opposite directions; and a third side surface 30e and a fourth side surface 30f that face toward opposite directions. The side surfaces 30c, 30d, 30e and 30f respectively face toward the side surfaces 2c, 2d, 2e and 2f of the main body 2.

The layer portion 10A further includes: an insulating portion 31 that covers at least one of the four side surfaces of the semiconductor chip 30; and a plurality of electrodes 32 electrically connected to the semiconductor chip 30. The insulating portion 31 has at least one end face 31a that is located in the at least one of the side surfaces of the main body 2 on which the wiring is disposed. In the example shown in FIG. 7, the insulating portion 31 covers all of the four side surfaces of the semiconductor chip 30, and has four end faces 31a located in the four side surfaces of the main body 2.

The second-type layer portion 10B includes its semiconductor chip 30 and insulating portion 31 as does the first-type layer portion 10A, but does not include the plurality of electrodes 32. As previously mentioned, the semiconductor chip 30 of the first-type layer portion 10A is a normally functioning one whereas the semiconductor chip 30 of the second-type layer portion 10B is a malfunctioning one. Hereinafter, a normally functioning semiconductor chip 30 will be referred to as a conforming semiconductor chip 30, and a malfunctioning semiconductor chip 30 will be referred to as a defective semiconductor chip 30.

In the layer portion(s) other than the uppermost one in a main body 2, the insulating portion 31 also covers the first surface 30a of the semiconductor chip 30 and the plurality of electrodes 32. In the uppermost layer portion in a main body 2, the insulating portion 31 does not cover the first surface 30a of the semiconductor chip 30. If the uppermost layer portion is the first-type layer portion 10A, the plurality of electrodes 32 are not covered by the insulating portion 31 but are exposed. The plurality of electrodes 32 of the uppermost layer portion 10A also function as the plurality of terminals 4. Note that the uppermost layer portion may also be configured so that the insulating portion 31 covers the first surface 30a of the semiconductor chip 30 and the plurality of electrodes 32, and that the terminals 4 are formed on the insulating portion 31 aside from the electrodes 32.

The second-type layer portion 10B may include any electrode or wiring as long as the electrode or wiring is other than one that is configured to be electrically connected to the semiconductor chip 30 and to have an end face located in the at least one of the side surfaces of the main body 2 on which the wiring 3 is disposed. For example, the second-type layer portion 10B may include an electrode that is electrically connected to the semiconductor chip 30 but does not have an end face located in the at least one of the side surfaces of the main body 2 on which the wiring 3 is disposed, and/or wiring that is intended for connection between terminals of the semiconductor chip 30.

The semiconductor chip 30 may be a memory chip that constitutes a memory such as a flash memory, DRAM, SRAM, MRAM, PROM, or FeRAM. In such a case, it is possible to implement a large-capacity memory by using the composite layered chip package 1 including a plurality of semiconductor chips 30. With the composite layered chip package 1 of the present embodiment, it is also possible to easily implement a memory of various capacities such as 64 GB (gigabytes), 128 GB, and 256 GB, by changing the number of the semiconductor chips 30 to be included in the composite layered chip package 1.

In the case where the semiconductor chip 30 includes a plurality of memory cells and where one or more of the memory cells are defective, the semiconductor chip 30 is still conforming if it can function normally by employing the redundancy technique.

The semiconductor chips 30 are not limited to memory chips, and may be used for implementing other devices such as CPUs, sensors, and driving circuits for sensors. The composite layered chip package 1 of the present embodiment is particularly suitable for implementing an SiP.

Figure 8:
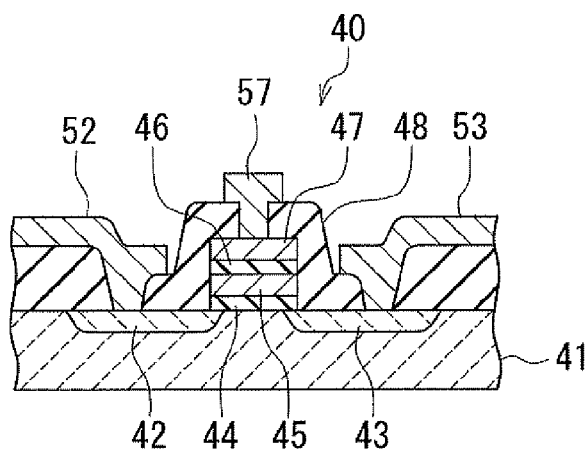
FIG. 8 is a cross-sectional view showing a part of the device included in the semiconductor chip.

Reference is now made to FIG. 8 to describe an example of the device included in the semiconductor chip 30. By way of example, the following description will be given for a case where the device included in the semiconductor chip 30 is a circuit including a plurality of memory cells that constitute a memory. FIG. 8 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

Next, a description will be given of a method of manufacturing the layered chip package according to the present embodiment and a method of manufacturing the composite layered chip package 1. The method of manufacturing the composite layered chip package 1 includes the steps of: fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S.

The step of fabricating a plurality of subpackages 1S includes, as a series of steps for forming each subpackage 1S, the step of fabricating at least one substructure that includes an array of a plurality of preliminary layer portions, each of the preliminary layer portions being intended to become any one of the layer portions 10 included in the main part 2M, the substructure being intended to be cut later at the position of the boundary between every adjacent preliminary layer portions; and the step of fabricating the subpackage 1S by using the at least one substructure.

The method of manufacturing the layered chip package according to the present embodiment is also a method of manufacturing a subpackage 1S in which the main body 2 includes a plurality of layer portions 10. The method of manufacturing the layered chip package includes the steps of: forming a plurality of structures each of which includes at least one main-body-forming portion, the main-body-forming portion being intended to be the main body 2 and having a pre-wiring surface on which the wiring 3 is to be formed later; surrounding the plurality of structures with a jig and thereby aligning the structures so that their respective pre-wiring surfaces face upward, the jig having a top surface that is lower in level than the pre-wiring surfaces; forming a resin layer using a resin film, the resin layer covering the jig and the plurality of structures; polishing the resin layer until the pre-wiring surfaces are exposed and thereby flattening the pre-wiring surfaces and a top surface of a portion of the resin layer that remains on the top surface of the jig; forming the wiring 3 on the pre-wiring surfaces of a plurality of main-body-forming portions included in the plurality of structures simultaneously, the step of forming the wiring 3 being performed after the step of flattening; and separating the plurality of main-body-forming portions with the wiring formed on the respective pre-wiring surfaces from each other so as to form the plurality of layered chip packages.

Figure 9:
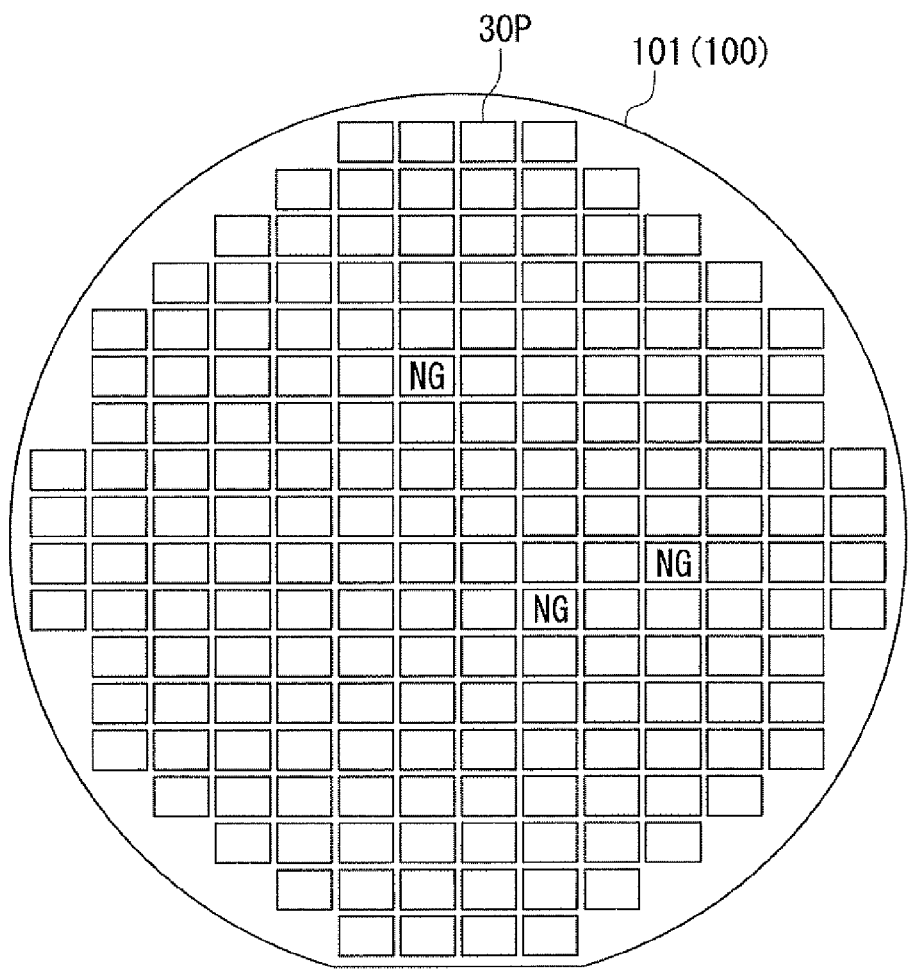
FIG. 9 is a plan view showing a pre-substructure wafer fabricated in a step of a method of manufacturing the layered chip package according to the embodiment of the invention.
Figure 10:
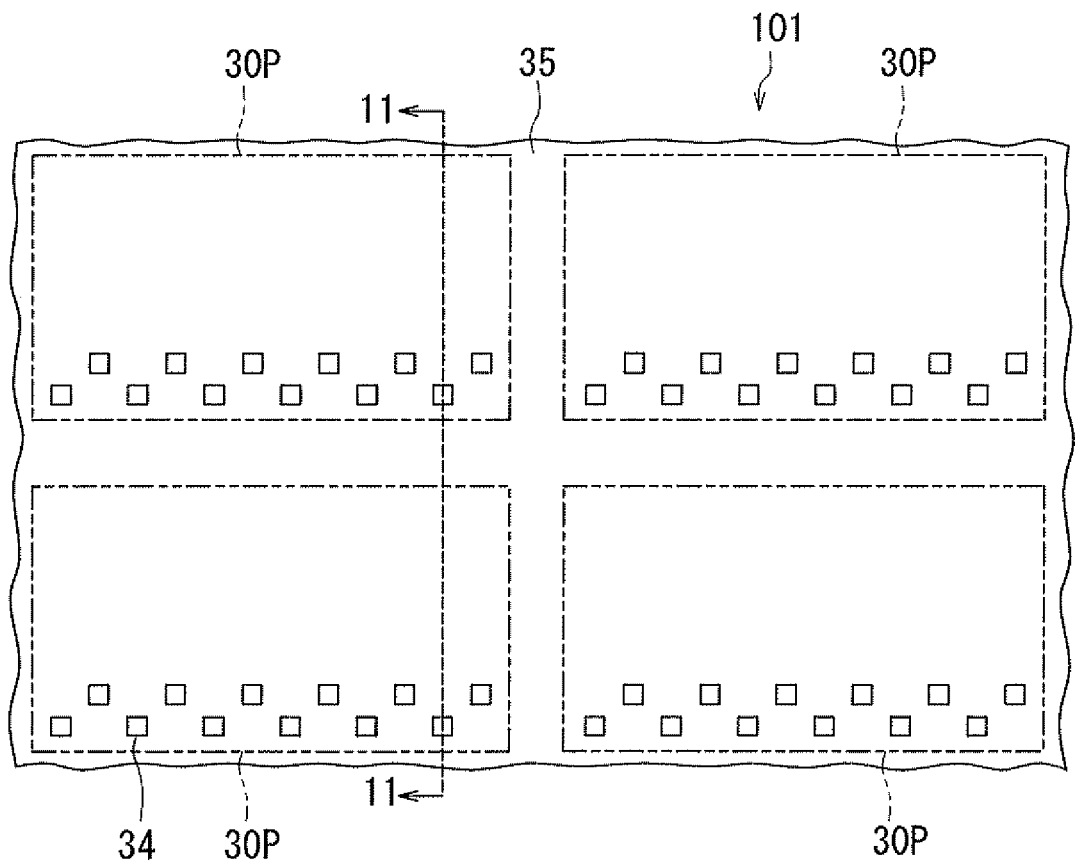
FIG. 10 is a magnified plan view showing a part of the pre-substructure wafer of FIG. 9.
Figure 11:
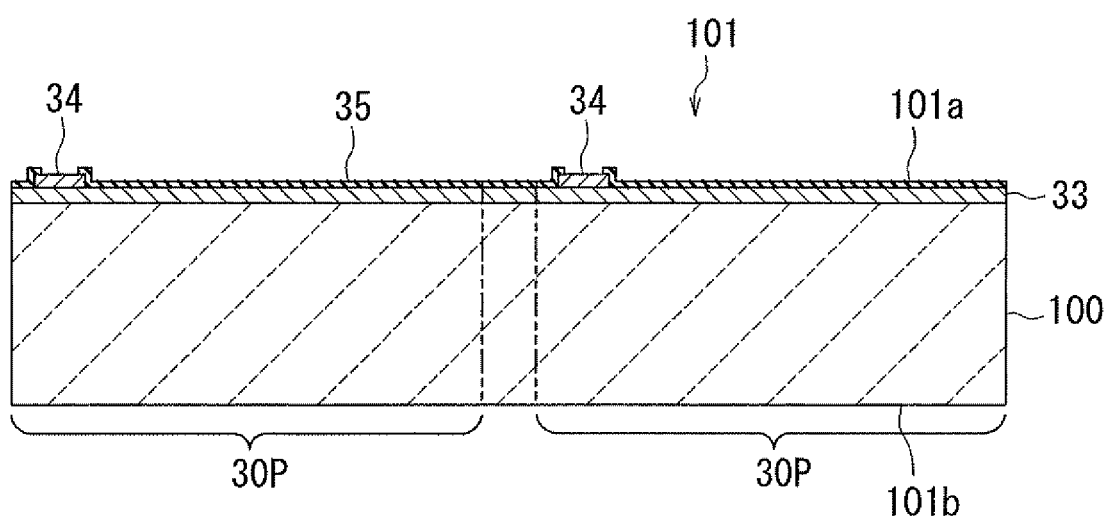
FIG. 11 shows a cross section taken along line 11-11 of FIG. 10.

Now, with reference to FIG. 9 to FIG. 25, a detailed description will be given of the step of fabricating at least one substructure in the step of fabricating a plurality of subpackages 1S. The following description will be given for a case where a plurality of substructures are fabricated. Therefore, the following is also the description of the step of fabricating a plurality of substructures in the method of manufacturing the layered chip package. In the step of fabricating at least one substructure, a pre-substructure wafer 101 is initially fabricated. The pre-substructure wafer 101 includes an array of a plurality of pre-semiconductor-chip portions 30P that are intended to become individual semiconductor chips 30. FIG. 9 is a plan view of the pre-substructure wafer 101. FIG. 10 is a magnified plan view showing a part of the pre-substructure wafer 101 of FIG. 9. FIG. 11 shows a cross section taken along line 11-11 of FIG. 10.

Specifically, in the step of fabricating the pre-substructure wafer 101, a semiconductor wafer 100 having two surfaces that face toward opposite directions is subjected to processing, such as a wafer process, at one of the two surfaces. The pre-substructure wafer 101 including an array of a plurality of pre-semiconductor-chip portions 30P is thereby fabricated, each of the pre-semiconductor-chip portions 30P including a device. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 9 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 11, the pre-semiconductor-chip portions 30P include a device-forming region 33 that is formed near one of the surfaces of the semiconductor wafer 100. The device-forming region 33 is a region where devices are formed by processing the one of the surfaces of the semiconductor wafer 100. The pre-semiconductor-chip portions 30P further include a plurality of electrode pads 34 that are disposed on the device-forming region 33, and a passivation film 35 that is made of an insulating material and disposed over the device-forming region 33. The passivation film 35 has a plurality of openings for exposing the top surfaces of the plurality of electrode pads 34. The plurality of electrode pads 34 are located in the positions corresponding to the plurality of electrodes 32 to be formed later, and are electrically connected to the devices formed in the device-forming region 33. Hereinafter, the surface of the pre-substructure wafer 101 located closer to the plurality of electrode pads 34 and the passivation film 35 will be referred to as a first surface 101a. The surface on the opposite side will be referred to as a second surface 101b.

In the step of fabricating a plurality of substructures, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 34 of each pre-semiconductor-chip portion 30P so that whether the pre-semiconductor-chip portion 30P functions normally or not is tested with the testing device. In FIG. 9, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-substructure wafer 101. The location information is used in an exposure step for forming a frame to be described later.

Figure 12:
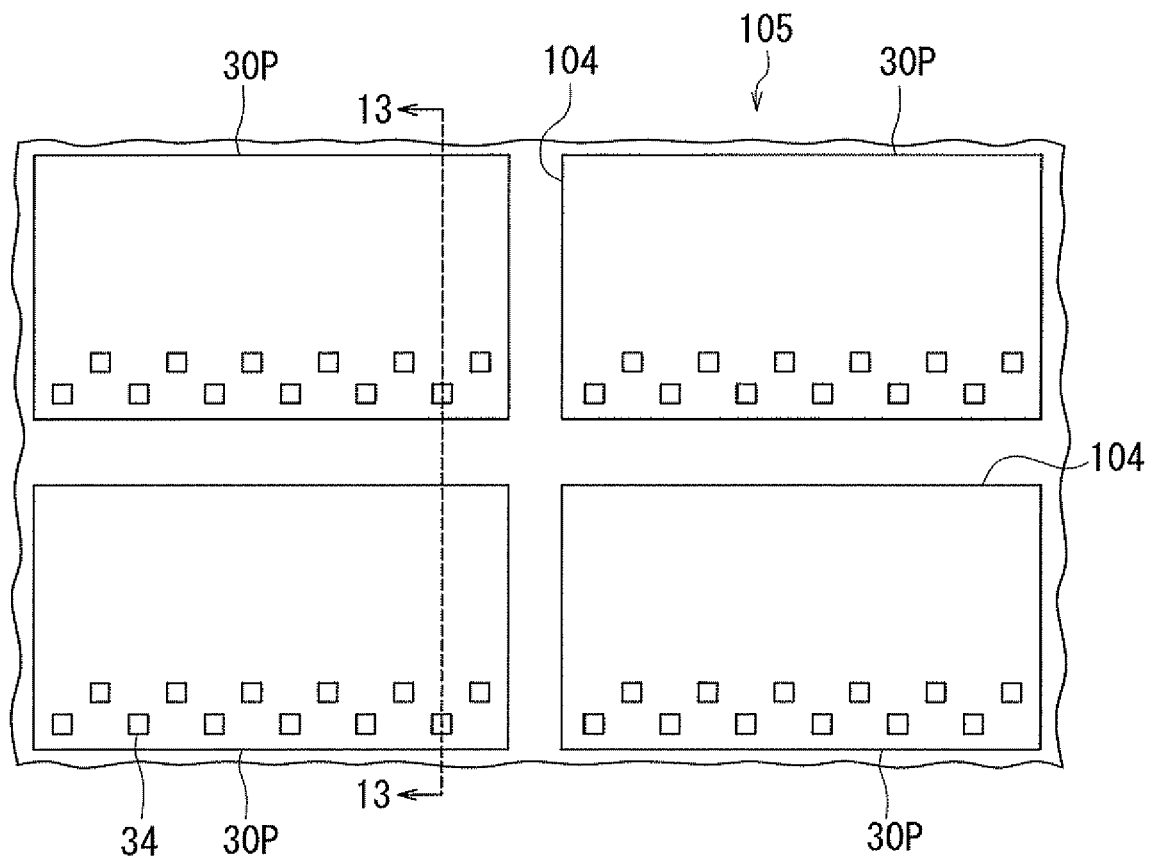
FIG. 12 is a plan view showing a step that follows the step shown in FIG. 10.
Figure 13:
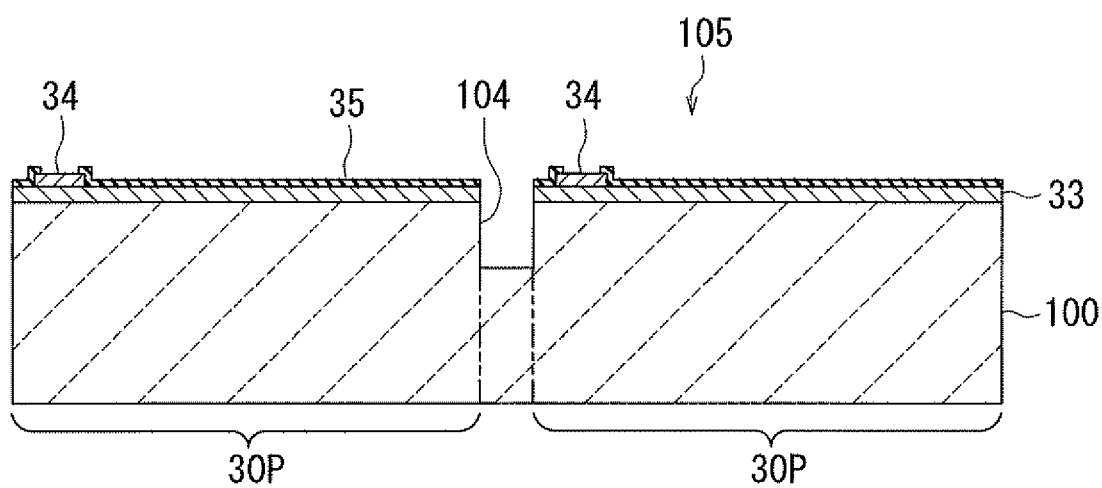
FIG. 13 shows a cross section taken along line 13-13 of FIG. 12.

FIG. 12 is a plan view showing a step that follows the step shown in FIG. 10. FIG. 13 shows a cross section taken along line 13-13 of FIG. 12. In this step, a plurality of grooves 104 that open in the first surface 101a of the pre-substructure wafer 101 are formed in the pre-substructure wafer 101 so as to define the respective areas of the plurality of pre-semiconductor-chip portions 30P. At the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 are each 10 to 150 µm wide, for example. The grooves 104 are each 30 to 150 µm deep, for example. For example, the grooves 104 may be formed by using a dicing saw, or by performing etching such as reactive ion etching. A pre-polishing substructure main body 105 is thus formed by the pre-substructure wafer 101 with the plurality of grooves 104 formed therein.

Figure 14:
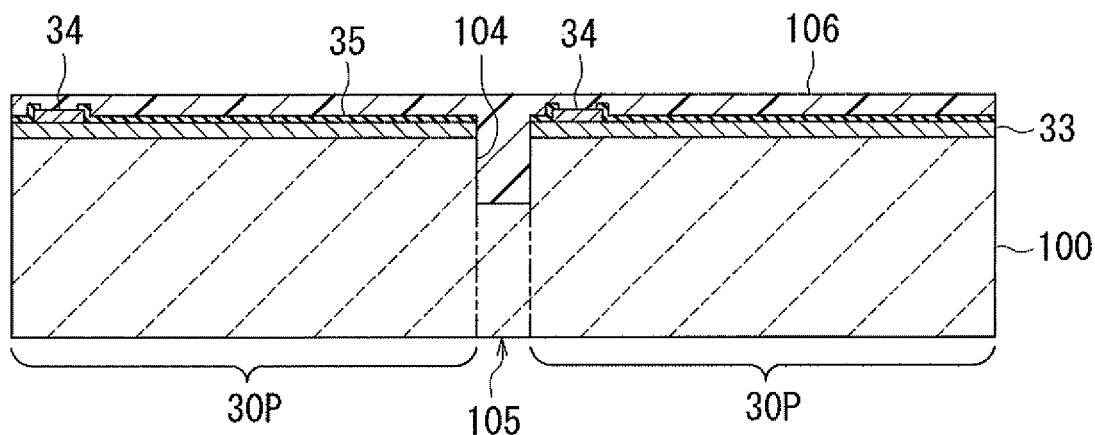
FIG. 14 is a cross-sectional view showing a step that follows the step shown in FIG. 13.

FIG. 14 shows a step that follows the step shown in FIG. 13. In this step, an insulating layer 106 is formed to fill the plurality of grooves 104 of the pre-polishing substructure main body 105 and to cover the plurality of electrode pads 34. The insulating layer 106 is to become a part of the insulating portion 31 later. The insulating layer 106 may be formed of a resin such as an epoxy resin or a polyimide resin. The insulating layer 106 may also be formed of a photosensitive material such as a polyimide resin containing a sensitizer.

Figure 15:
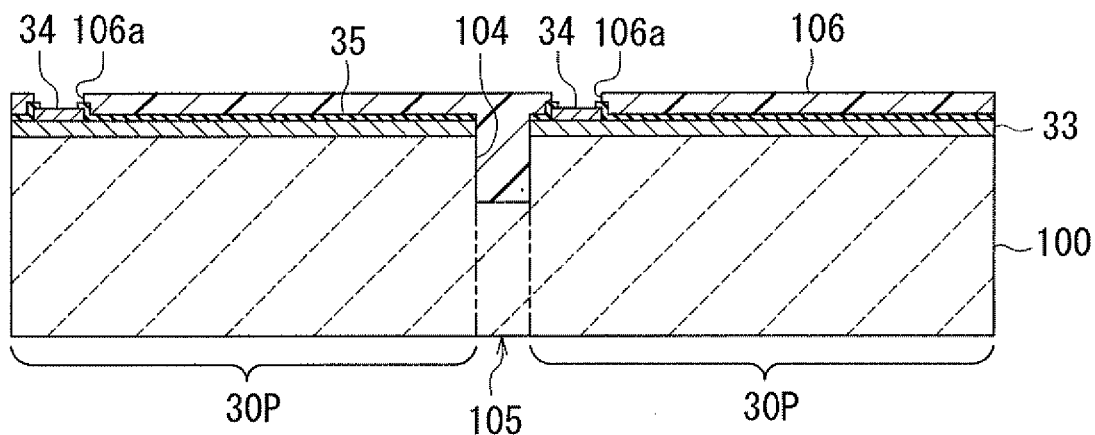
FIG. 15 is a cross-sectional view showing a step that follows the step shown in FIG. 14.

FIG. 15 shows a step that follows the step shown in FIG. 14. In this step, a plurality of openings 106a for exposing the plurality of electrode pads 34 are formed in the insulating layer 106. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the plurality of grooves 104, and a second layer that covers the first layer and the plurality of electrode pads 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer. The first layer may be flattened at the top by ashing or chemical mechanical polishing (CMP), for example, before forming the second layer on the first layer.

Next, performed is the step of forming the plurality of electrodes 32 in the normally functioning pre-semiconductor-chip portions 30P while not forming the plurality of electrodes 32 in the malfunctioning pre-semiconductor-chip portions 30P. This step includes the steps of: forming a photoresist layer that is intended to be used for forming the plurality of electrodes 32 in individual pre-semiconductor-chip portions 30P and includes a plurality of areas corresponding to all the pre-semiconductor-chip portions 30P; forming a frame by patterning the photoresist layer by photolithography, the frame having a plurality of openings that are intended to accommodate the plurality of electrodes 32 later, the openings being formed in areas of the photoresist layer that correspond to the normally functioning pre-semiconductor-chip portions 30P; and forming the plurality of electrodes 32 so that they are accommodated in the plurality of openings of the frame.

Figure 16:
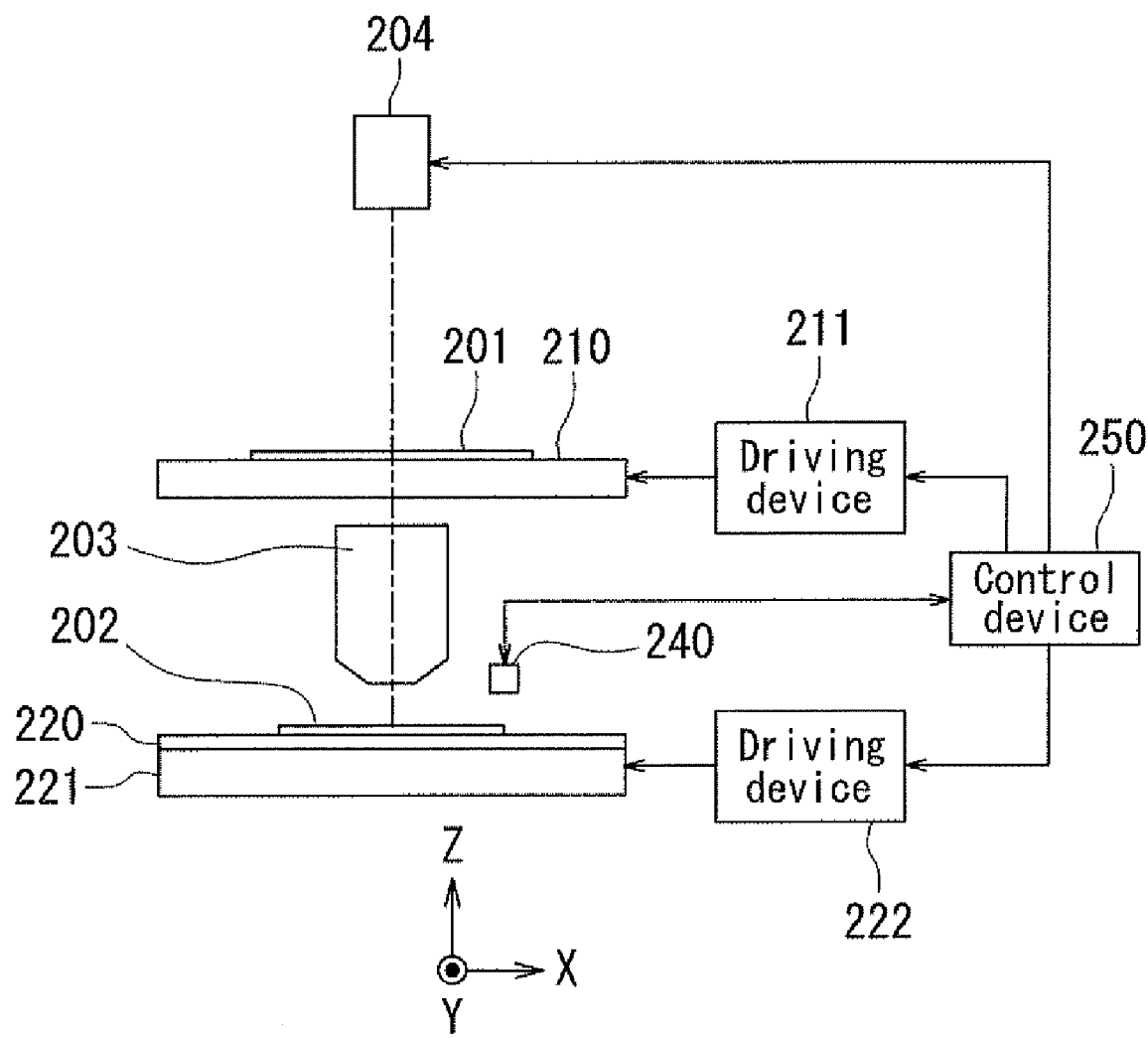
FIG. 16 is an explanatory diagram showing an example of the configuration of an exposure apparatus for use in the method of manufacturing the layered chip package according to the embodiment of the invention.

Reference is now made to FIG. 16 to describe an example of the configuration of an exposure apparatus for use in the step of forming the frame. The exposure apparatus shown in FIG. 16 is a stepping projection exposure apparatus, or a so-called stepper. The exposure apparatus includes: a mask stage 210 for retaining a mask 201; a driving device 211 for driving the mask stage 210 to move or replace the mask 201; a wafer stage 220 for retaining a wafer 202; a moving mechanism 221 for moving the wafer stage 220; a driving device 222 for driving the moving mechanism 221; a reduction projection optical system 203; an illumination device 204; a detection device 240 for detecting the location of the wafer 202; and a control device 250 for controlling the illumination device 204, the driving devices 211 and 222 and the detection device 240.

The mask stage 210 is disposed above the wafer stage 220. The reduction projection optical system 203 is disposed between the mask stage 210 and the wafer stage 220. The illumination device 204 is disposed above the mask stage 210 and applies light for exposure to the mask 201.

The moving mechanism 221 is capable of moving the wafer stage 220 in X, Y and Z directions shown in FIG. 16 and capable of changing the angle of inclination of the wafer stage 220 with respect to the X-Y plane. The X direction and the Y direction are orthogonal to each other and are both orthogonal to the direction of the optical axis of the reduction projection optical system 203. The Z direction is parallel to the direction of the optical axis of the reduction projection optical system 203. The detection device 240 detects the location of the surface of the wafer 202 and the angle of inclination of the surface of the wafer 202 with respect to the X-Y plane.

The control device 250 has a microprocessor unit (MPU), read only memory (ROM) and random access memory (RAM).

To expose the wafer 202 to light using this exposure apparatus, a plurality of pattern projection regions are defined on the surface of the wafer 202. A ray bundle emitted from the illumination device 204 passes through the mask 201 and is applied to one of the pattern projection regions by the reduction projection optical system 203. The mask pattern of the mask 201 is thereby projected onto the one of the pattern projection regions via the reduction projection optical system 203 so as to perform the process of exposing the one of the pattern projection regions. After performing the process of exposing the one of the pattern projection regions based on the mask pattern, the exposure apparatus moves the wafer 202 in the X or Y direction, and performs the same exposure process for a next one of the pattern projection regions.

Figure 17:
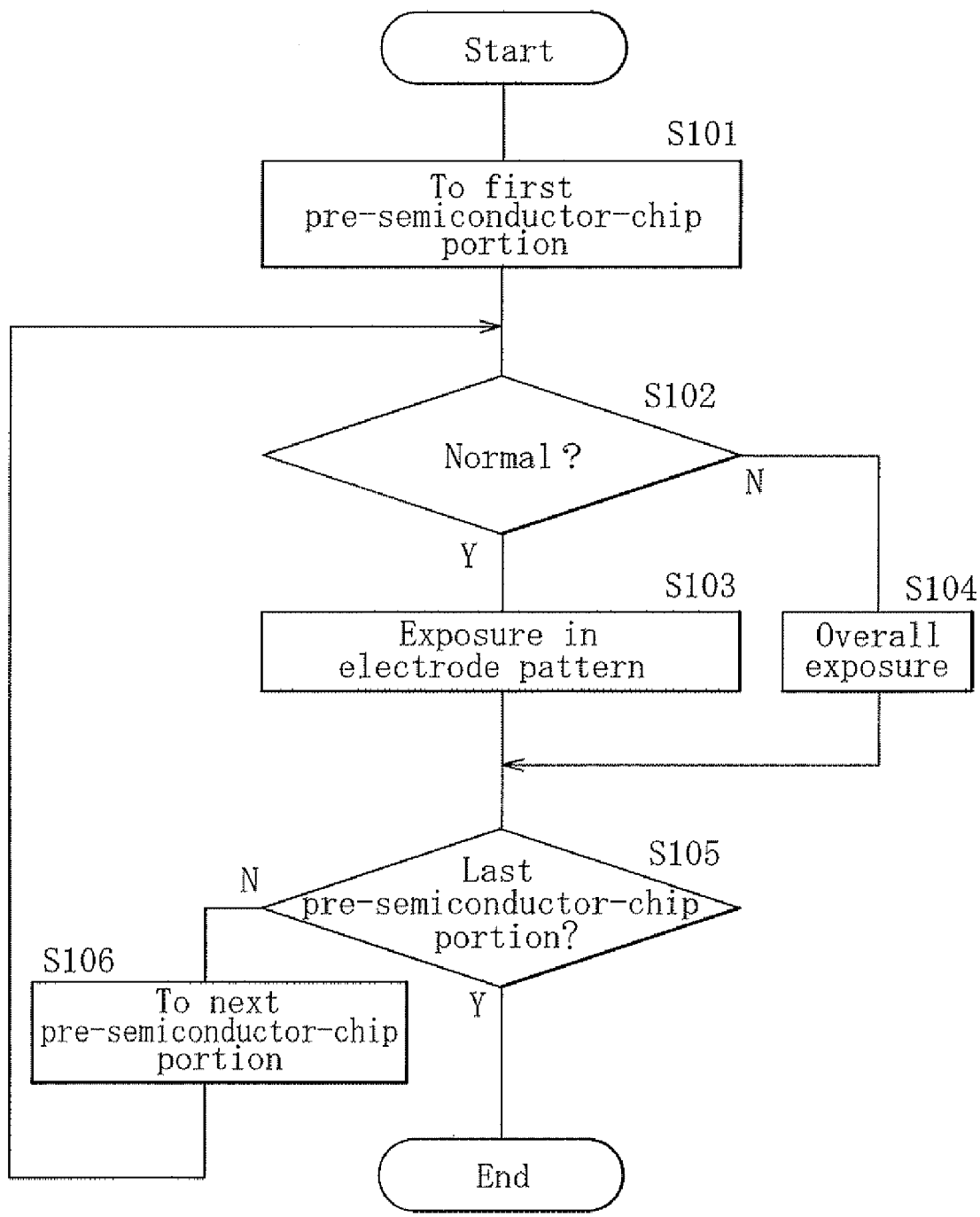
FIG. 17 is a flow chart showing an exposure step for forming the plurality of electrodes in the method of manufacturing the layered chip package according to the embodiment of the invention.

Next, with reference to the flowchart of FIG. 17, a description will be given of the step of exposing the photoresist layer to light in order to form the frame to be used for forming the plurality of electrodes 32. The following description will be given for situations where the photoresist layer is of negative type. The photoresist layer of negative type is soluble in a developing solution for the portions unirradiated with light, and becomes insoluble in the developing solution for the portions irradiated with light. In this exposure step, the photoresist layer is exposed to light so that a latent image corresponding to the plurality of electrodes 32 is formed in the areas of the photoresist layer that correspond to the normally functioning pre-semiconductor-chip portions 30P while any latent image corresponding to the plurality of electrodes 32 is not formed in the areas of the photoresist layer that correspond to the malfunctioning pre-semiconductor-chip portions 30P. In the exposure step, first, among the plurality of pattern projection regions corresponding to the plurality of pre-semiconductor-chip portions 30P, a pattern projection region corresponding to a first pre-semiconductor-chip portion 30P is selected to be exposed by the exposure apparatus of FIG. 16 (Step S101). Next, the control device 250 judges whether the pre-semiconductor-chip portion 30P corresponding to the selected pattern projection region is a normally functioning one or not (Step S102). The location information on the normally functioning pre-semiconductor-chip portions 30P and the malfunctioning pre-semiconductor-chip portions 30P in each pre-substructure wafer 101 obtained by the wafer sort test is input to and held by the control device 250. The control device 250 makes a judgment in Step S102 based on the location information.

If the pre-semiconductor-chip portion 30P is judged as a normally functioning one (Y) in Step S102, the area of the photoresist layer corresponding to the normally functioning pre-semiconductor-chip portion 30P is exposed to light in a pattern corresponding to the plurality of electrodes 32 (hereinafter referred to as an electrode pattern) by using a mask 201 that has the electrode pattern (Step S103). Specifically, the electrode pattern is such a pattern that the parts of the pattern projection region where to form the openings to accommodate the electrodes 32 later are not irradiated with light while the other parts of the pattern projection region are irradiated with light. As a result of this exposure, the latent image corresponding to the plurality of electrodes 32 is formed in the area of the photoresist layer corresponding to the normally functioning pre-semiconductor-chip portion 30P. To be more specific, after this exposure, the area of the photoresist layer corresponding to the normally functioning pre-semiconductor-chip portion 30P remains soluble in the developing solution for the parts where to form the openings to accommodate the electrodes 32 later, and becomes insoluble in the developing solution for the other parts.

If the pre-semiconductor-chip portion 30P is judged as a malfunctioning one (N) in Step S102, the area of the photoresist layer corresponding to the malfunctioning pre-semiconductor-chip portion 30P is subjected to an overall exposure by using a mask 201 that entirely passes light, or without using any mask 201 (Step S104). As a result, any latent image corresponding to a plurality of electrodes that are connected to the malfunctioning pre-semiconductor-chip portion 30P and each have an end face located in the at least one of the side surfaces of the main body 2 on which the wiring 3 is disposed is not formed in the area of the photoresist layer corresponding to the malfunctioning pre-semiconductor-chip portion 30P. To be more specific, the entire area of the photoresist layer corresponding to the malfunctioning pre-semiconductor-chip portion 30P becomes insoluble in the developing solution. If the second-type layer portion 10B includes any electrode or wiring that is other than one configured to be electrically connected to the defective semiconductor chip 30 and to have an end face located in the at least one of the side surfaces of the main body 2 on which the wiring 3 is disposed, an exposure is performed in Step S104 so that a latent image corresponding to such an electrode or wiring is formed, instead of the overall exposure. In this case also, any latent image corresponding to a plurality of electrodes that are connected to the malfunctioning pre-semiconductor-chip portion 30P and each have an end face located in the at least one of the side surfaces of the main body 2 on which the wiring 3 is disposed is not formed in the area of the photoresist layer corresponding to the malfunctioning pre-semiconductor-chip portion 30P.

After Step S103 or S104 is performed, the control device 250 judges whether the pattern projection region that has undergone the exposure in Step S103 or S104 is the region corresponding to the last pre-semiconductor-chip portion 30P or not (Step S105). If the pattern projection region is judged as corresponding to the last pre-semiconductor-chip portion 30P (Y), the exposure step ends. If the pattern projection region is judged as not corresponding to the last pre-semiconductor-chip portion 30P (N), a pattern projection region corresponding to a next pre-semiconductor-chip portion 30P is selected to be exposed (Step S106) and the process is repeated from Step S102.

Figure 18A:
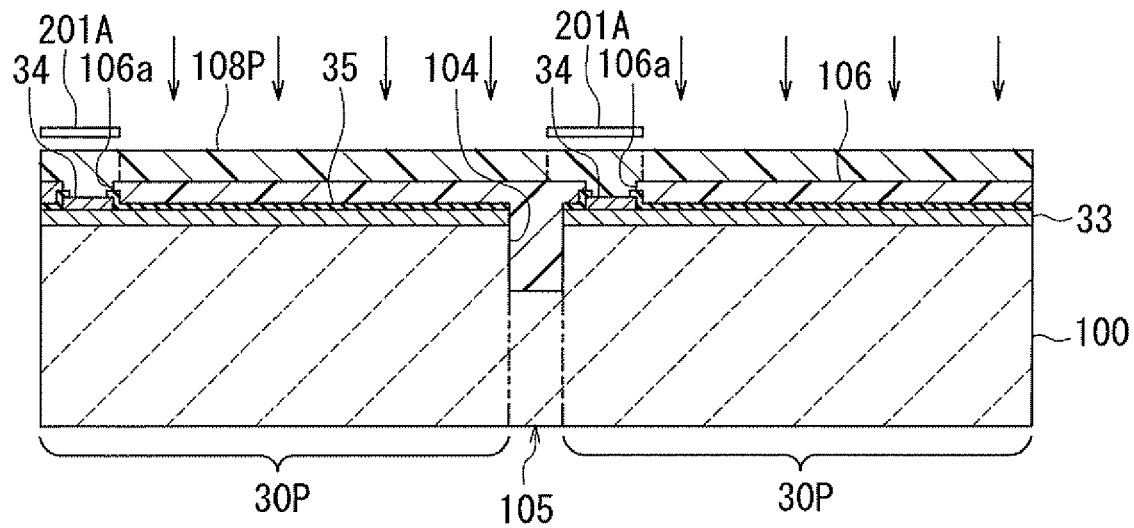
FIG. 18A and FIG. 18B are cross-sectional views showing a step that follows the step shown in FIG. 15.
Figure 18B:
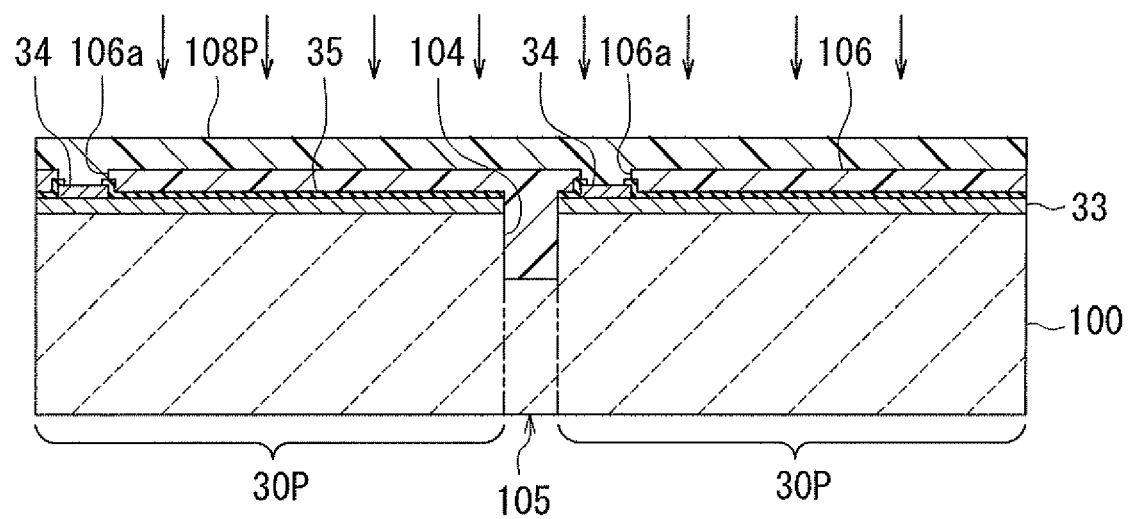

FIG. 18A and FIG. 18B show a step that follows the step shown in FIG. 15. FIG. 18A shows areas corresponding to the normally functioning pre-semiconductor-chip portions 30P. FIG. 18B shows areas corresponding to the malfunctioning pre-semiconductor-chip portions 30P.

In the step shown in FIG. 18A and FIG. 18B, first, a photoresist layer 108P including a plurality of areas corresponding to all the pre-semiconductor-chip portions 30P is formed. Next, as shown in FIG. 18A, the areas of the photoresist layer 108P that correspond to the normally functioning pre-semiconductor-chip portions 30P are exposed to light in the electrode pattern in Step S103 of FIG. 17 by using a mask 201A that has the electrode pattern. On the other hand, the areas of the photoresist layer 108P that correspond to the malfunctioning pre-semiconductor-chip portions 30P are subjected to an overall exposure in Step S104 of FIG. 17, as shown in FIG. 18B.

Figure 19A:
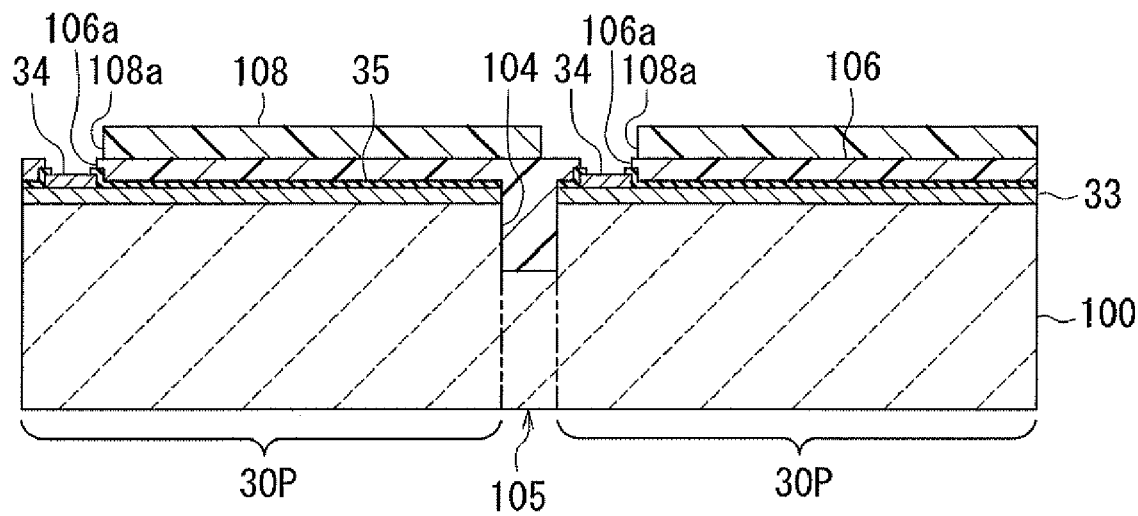
FIG. 19A and FIG. 19B are cross-sectional views showing a step that follows the step shown in FIG. 18A and FIG. 18B.
Figure 19B:
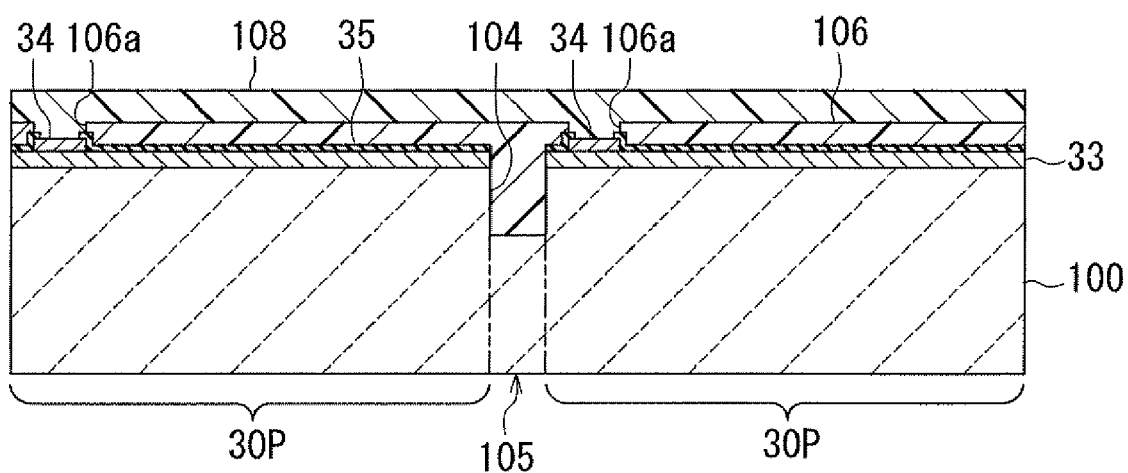

FIG. 19A and FIG. 19B show a step that follows the step shown in FIG. 18A and FIG. 18B. FIG. 19A shows areas corresponding to the normally functioning pre-semiconductor-chip portions 30P. FIG. 19B shows areas corresponding to the malfunctioning pre-semiconductor-chip portions 30P. In this step, the photoresist layer 108P is developed with a developing solution. A frame 108 is thereby formed. In the areas corresponding to the normally functioning pre-semiconductor-chip portions 30P, as shown in FIG. 19A, a plurality of openings 108a to accommodate the plurality of electrodes 32 later are formed in the frame 108. On the other hand, in the areas corresponding to the malfunctioning pre-semiconductor-chip portions 30P, no openings 108a are formed in the frame 108 as shown in FIG. 19B.

Figure 20A:
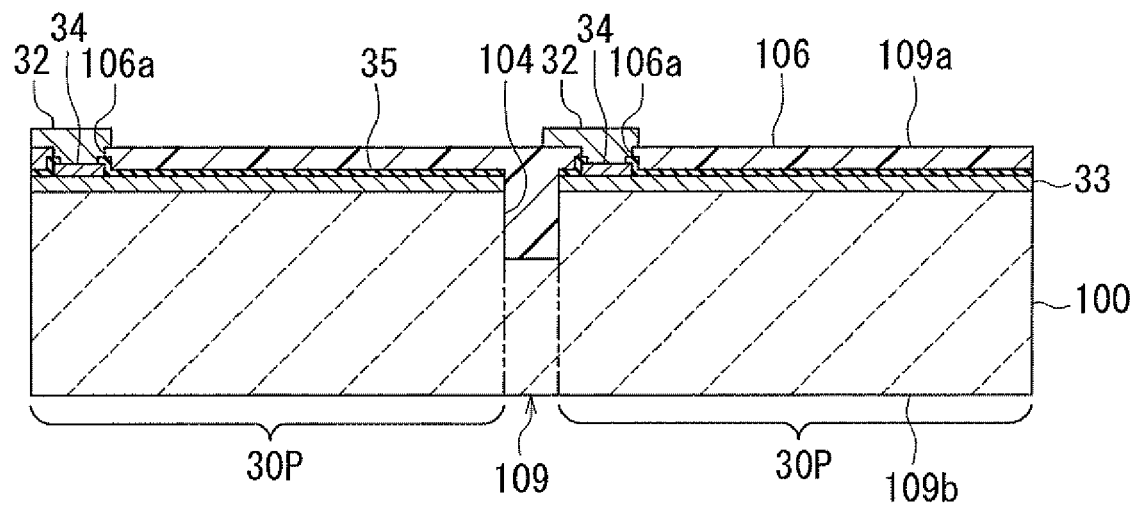
FIG. 20A and FIG. 20B are cross-sectional views showing a step that follows the step shown in FIG. 19A and FIG. 19B.
Figure 20B:
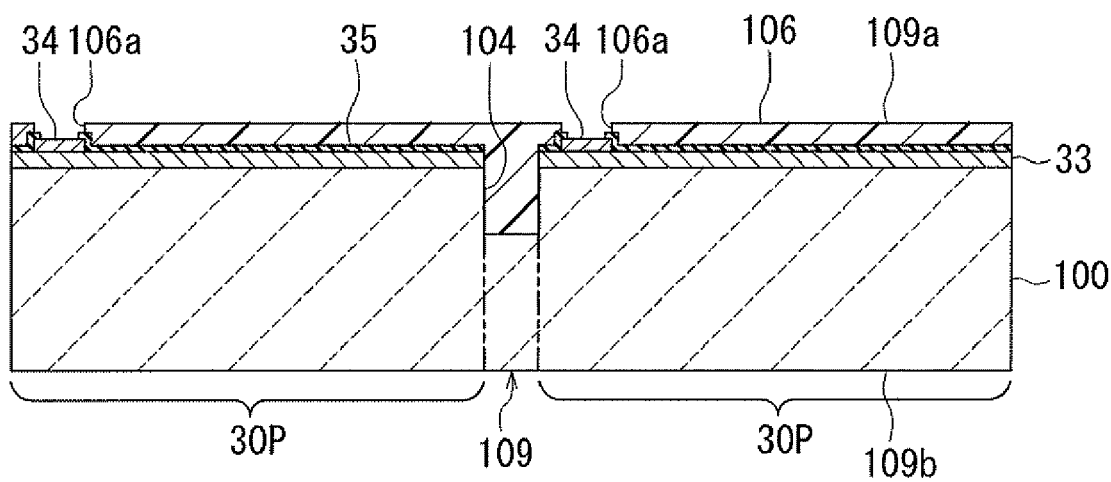
Figure 21:
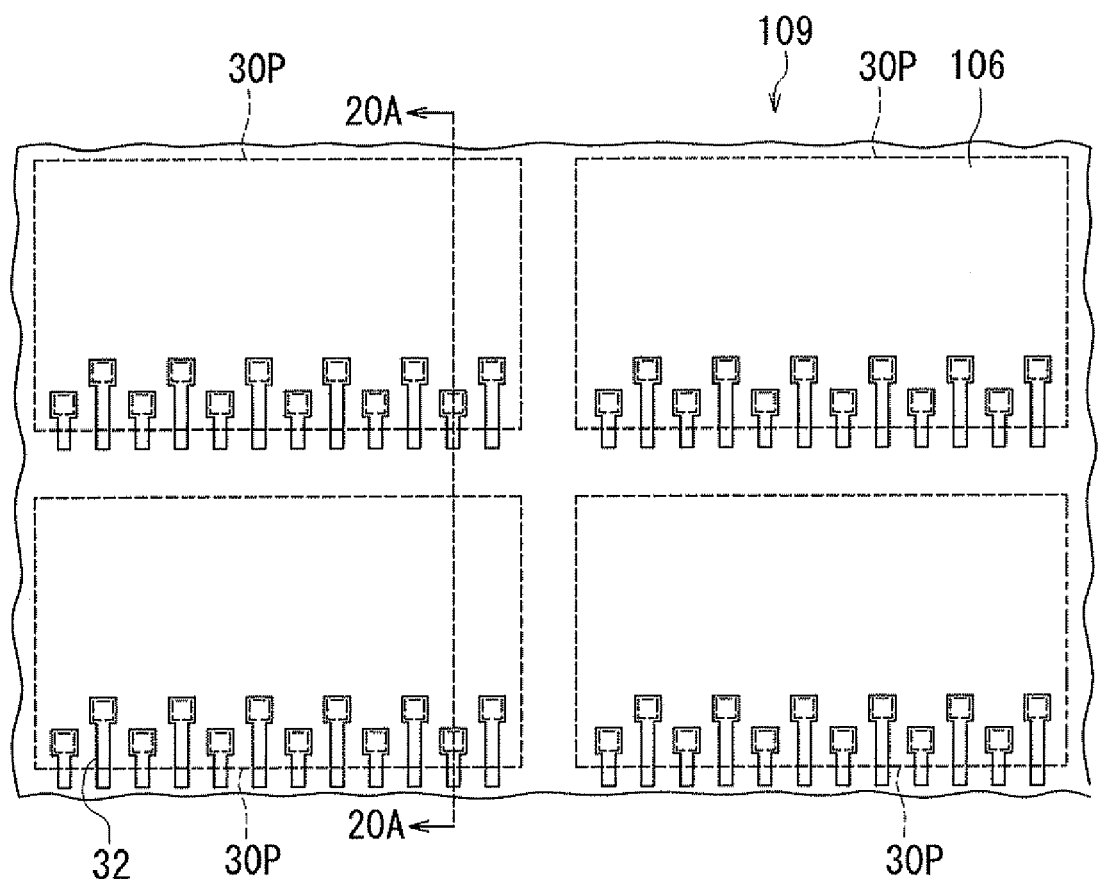
FIG. 21 is a plan view showing the step of FIG. 20A.

FIG. 20A, FIG. 20B and FIG. 21 show a step that follows the step shown in FIG. 19A and FIG. 19B. FIG. 20A and FIG. 21 show areas corresponding to the normally functioning pre-semiconductor-chip portions 30P. FIG. 20B shows areas corresponding to the malfunctioning pre-semiconductor-chip portions 30P. FIG. 20A shows a cross section taken along line 20A-20A of FIG. 21. In this step, the plurality of electrodes 32 are formed in the plurality of openings 108a of the frame 108 by, for example, plating, in the areas corresponding to the normally functioning pre-semiconductor-chip portions 30P as shown in FIG. 20A. The plurality of electrodes 32 are formed such that part of each of the electrodes 32 lies on the insulating layer 106. The electrodes 32 are connected to the electrode pads 34 through the openings 106a. In the areas corresponding to the malfunctioning pre-semiconductor-chip portions 30P, as shown in FIG. 20B, the plurality of electrodes 32 are not formed since the plurality of openings 108a are not formed in the frame 108. A pre-polishing substructure 109 shown in FIG. 20A, FIG. 20B and FIG. 21 is thereby fabricated. The pre-polishing substructure 109 has a first surface 109a corresponding to the first surface 101a of the pre-substructure wafer 101, and a second surface 109b corresponding to the second surface 101b of the pre-substructure wafer 101.

The electrodes 32 are formed of a conductive material such as Cu. In the case of forming the electrodes 32 by plating, a seed layer for plating is formed on the insulating layer 106 before forming the photoresist layer. Next, the photoresist layer is formed on the seed layer. The photoresist layer is then patterned by photolithography to thereby form the frame 108. Next, plating layers that are intended to constitute respective portions of the electrodes 32 are formed by plating on the seed layer in the openings 108a of the frame 108. The plating layers are 5 to 15 μm thick, for example. Next, the frame 108 is removed, and portions of the seed layer other than those lying under the plating layers are also removed by etching. The electrodes 32 are thus formed by the plating layers and the remaining portions of the seed layer under the plating layers.

Figure 22:
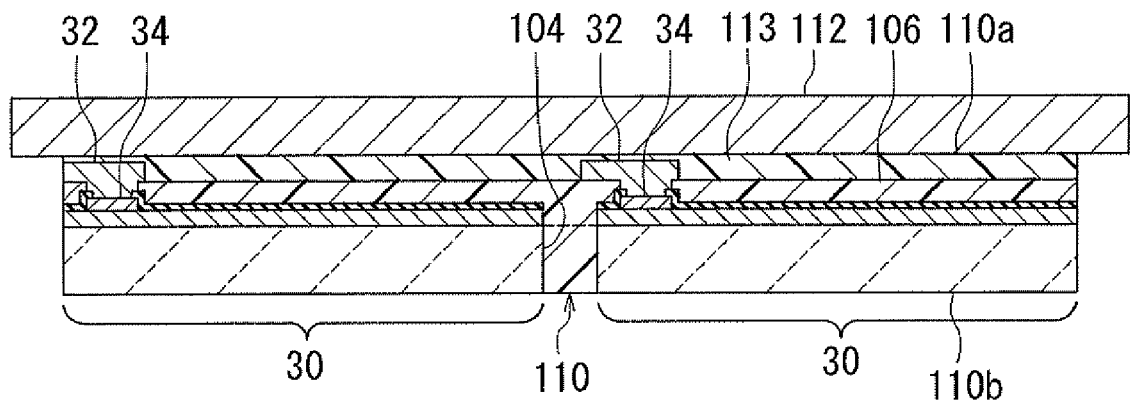
FIG. 22 is a cross-sectional view showing a step that follows the step shown in FIG. 20A to FIG. 21.

FIG. 22 shows a step that follows the step shown in FIG. 20A to FIG. 21. In this step, using an insulating adhesive, the pre-polishing substructure 109 is initially bonded to a plate-shaped jig 112 shown in FIG. 22 with the first surface 109a of the pre-polishing substructure 109 arranged to face a surface of the jig 112. Hereinafter, the pre-polishing substructure 109 bonded to the jig 112 will be referred to as a first pre-polishing substructure 109. The reference numeral 113 in FIG. 22 indicates an insulating layer 113 formed by the adhesive.

Next, the second surface 109b of the first pre-polishing substructure 109 is polished. This polishing is performed until the plurality of grooves 104 are exposed. By polishing the second surface 109b of the first pre-polishing substructure 109, the first pre-polishing substructure 109 is thinned. This forms a substructure 110 in the state of being bonded to the jig 112. The substructure 110 has a thickness of 30 to 100 μm, for example. Hereinafter, the substructure 110 bonded to the jig 112 will be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30.

Figure 23:
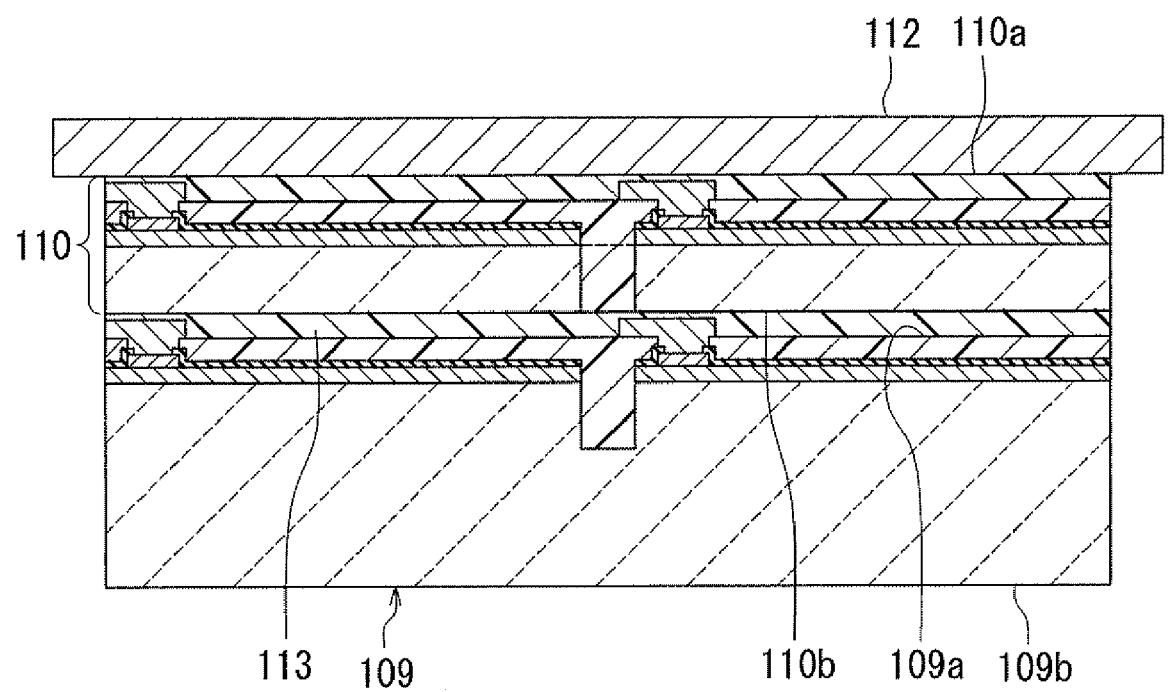
FIG. 23 is a cross-sectional view showing a step that follows the step shown in FIG. 22.

FIG. 23 shows a step that follows the step shown in FIG. 22. In this step, using an insulating adhesive, a pre-polishing substructure 109 is initially bonded to the first substructure 110 bonded to the jig 112. The pre-polishing substructure 109 is bonded to the first substructure 110 with the first surface 109a arranged to face the polished surface, i.e.; the second surface 110b, of the first substructure 110. Hereinafter, the pre-polishing substructure 109 to be bonded to the first substructure 110 will be referred to as a second pre-polishing substructure 109. The insulating layer 113 formed by the adhesive between the first substructure 110 and the second pre-polishing substructure 109 covers the plurality of electrodes 32 of the second pre-polishing substructure 109, and is to become part of the insulating portion 31 later.

Next, although not shown, the second surface 109b of the second pre-polishing substructure 109 is polished. This polishing is performed until the plurality of grooves 104 are exposed. By polishing the second surface 109b of the second pre-polishing substructure 109, the second pre-polishing substructure 109 is thinned. This forms a second substructure 110 in the state of being bonded to the first substructure 110. The second substructure 110 has a thickness of, for example, 30 to 100 μm, as does the first substructure 110.

Figure 24:
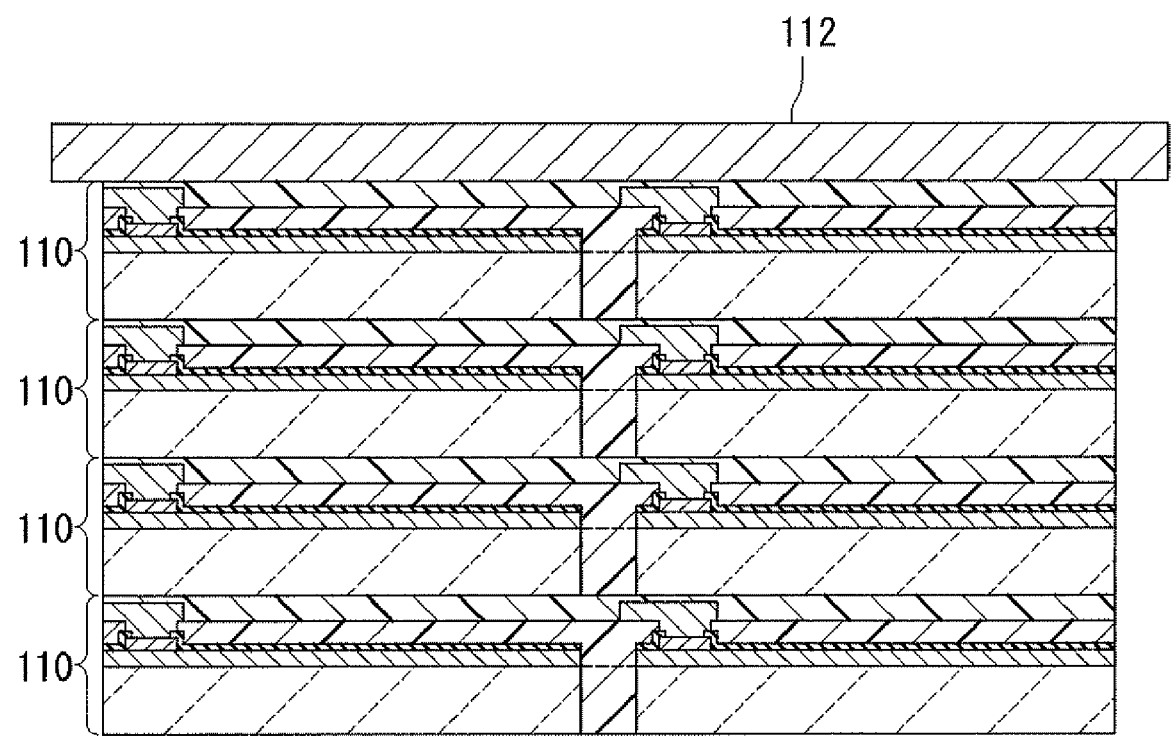
FIG. 24 is a cross-sectional view showing a step that follows the step shown in FIG. 23.

The same step as shown in FIG. 23 may subsequently be repeated to form three or more substructures 110 into a stack. FIG. 24 shows the case where four substructures 110 are formed into a stack.

Figure 25:
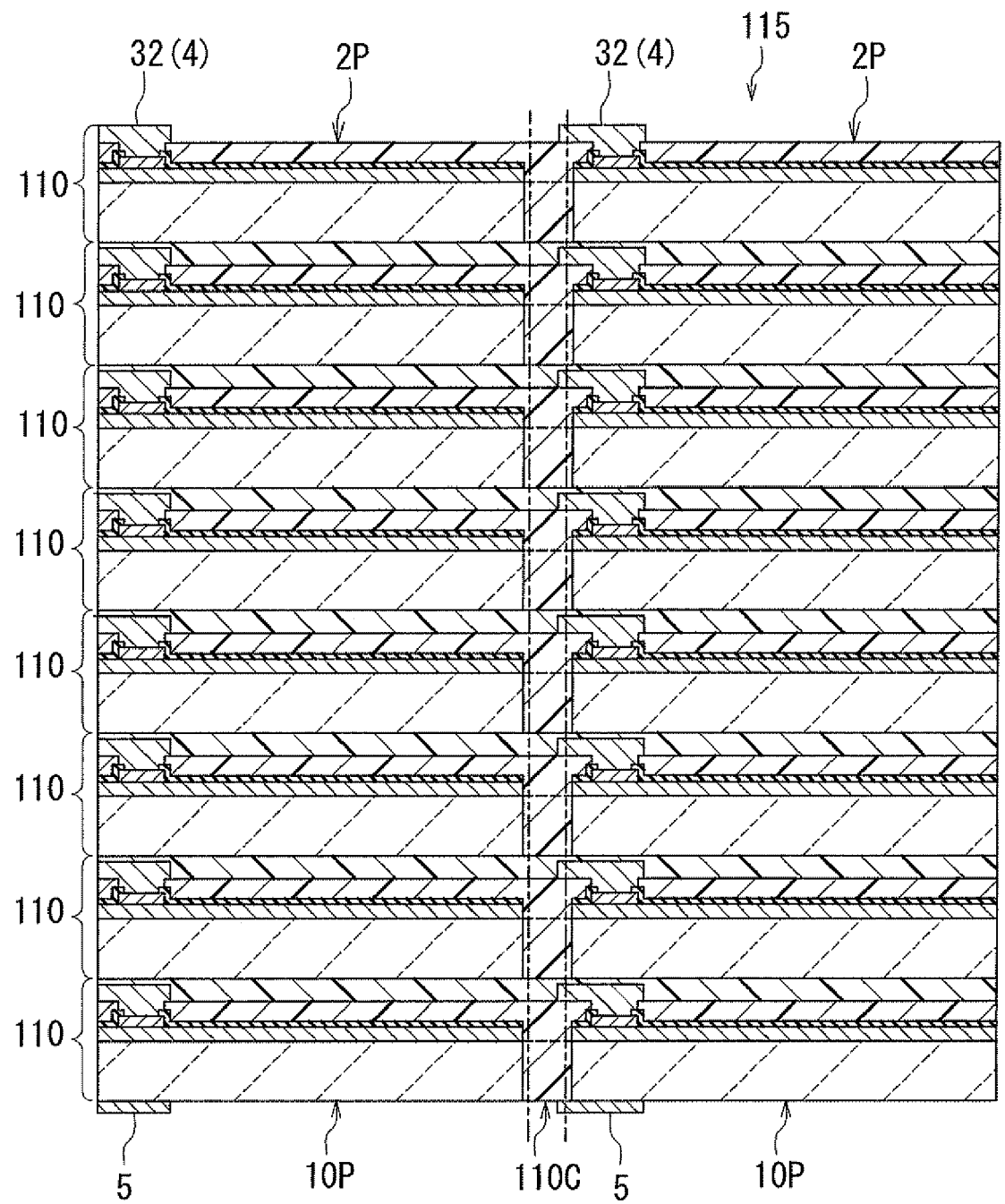
FIG. 25 is a cross-sectional view showing a part of a first layered substructure fabricated in a step that follows the step shown in FIG. 24.

FIG. 25 shows a step that follows the step shown in FIG. 24. After the same step as shown in FIG. 23 is repeated to form a predetermined number of substructures 110 into a stack, the stack of the predetermined number of substructures 110 is released from the jig 112. FIG. 25 shows an example where a stack of eight substructures 110 is formed.

Next, as shown in FIG. 25, the insulating layer 113 is removed from the uppermost substructure 110 of the stack. This exposes the plurality of electrodes 32 of the uppermost substructure 110. The exposed plurality of electrodes 32 also function as the plurality of terminals 4. In addition, the plurality of terminals 5 are formed on the bottom surface of the lowermost substructure 110 of the stack. Consequently, there is formed a first layered substructure 115 including the plurality of substructures 110 stacked. Each substructure 110 includes an array of a plurality of preliminary layer portions 10P. Each preliminary layer portion 10P is to become any one of the layer portions 10 included in the main part 2M of the main body 2. The substructures 110 are to be cut later at the positions of the boundaries between every adjacent preliminary layer portions 10P. In FIG. 25, the reference numeral 110C indicates the cutting positions of the substructures 110. The first layered substructure 115 includes an array of a plurality of pre-separation main bodies 2P. The plurality of pre-separation main bodies 2P are to be separated from each other into individual main bodies 2 later. In the example shown in FIG. 25, each pre-separation main body 2P includes eight preliminary layer portions 10P.

Hereinafter, the process for fabricating a subpackage by using at least one substructure will be described in detail with reference to FIG. 26 to FIG. 38. The following will describe an example where the first layered substructure 115 of FIG. 25, which includes eight substructures 110 stacked, is used to fabricate a plurality of subpackages each including eight layer portions 10.

Figure 26:
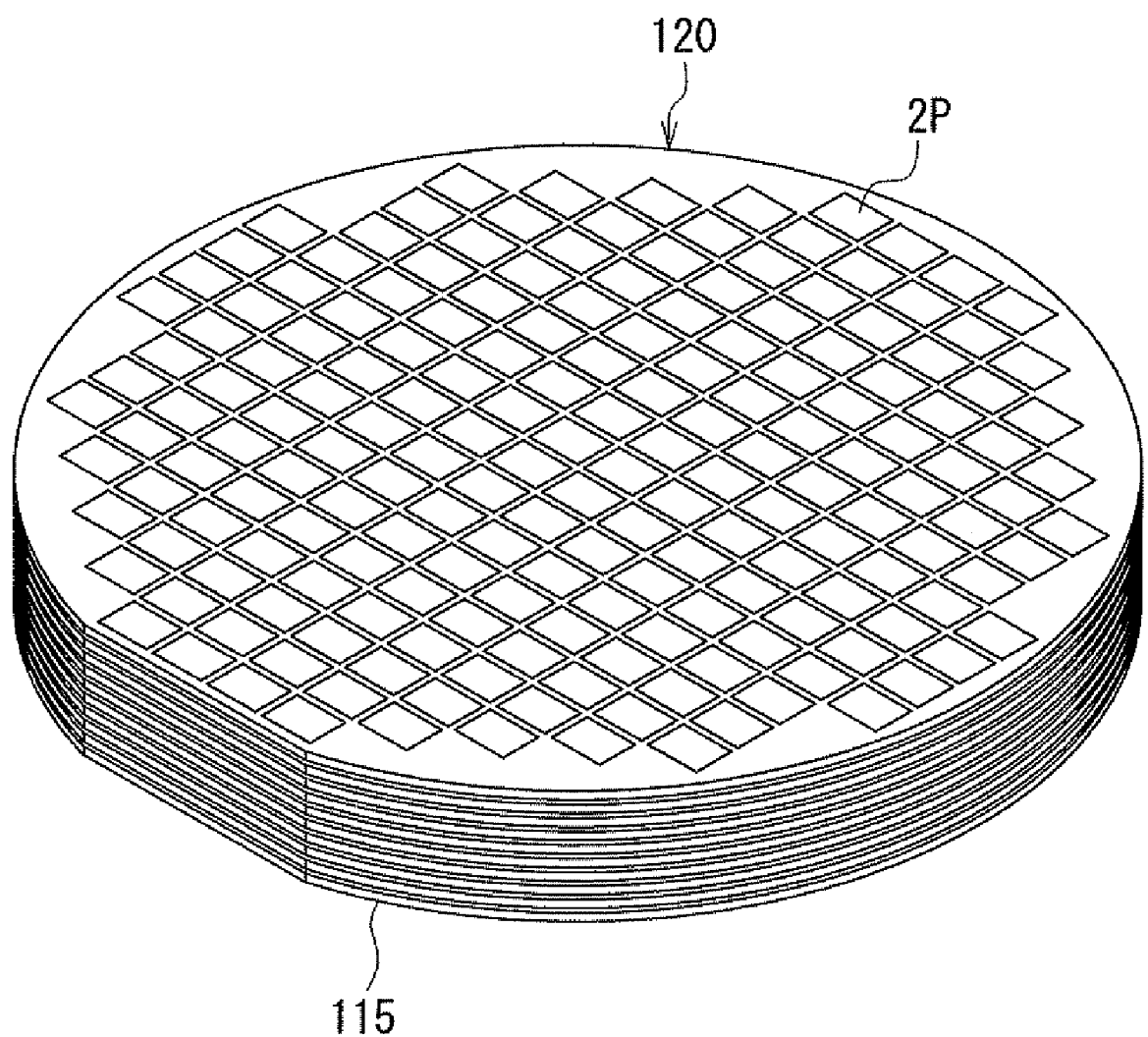
FIG. 26 is a perspective view showing a second layered substructure fabricated in a step that follows the step shown in FIG. 25.
Figure 27:
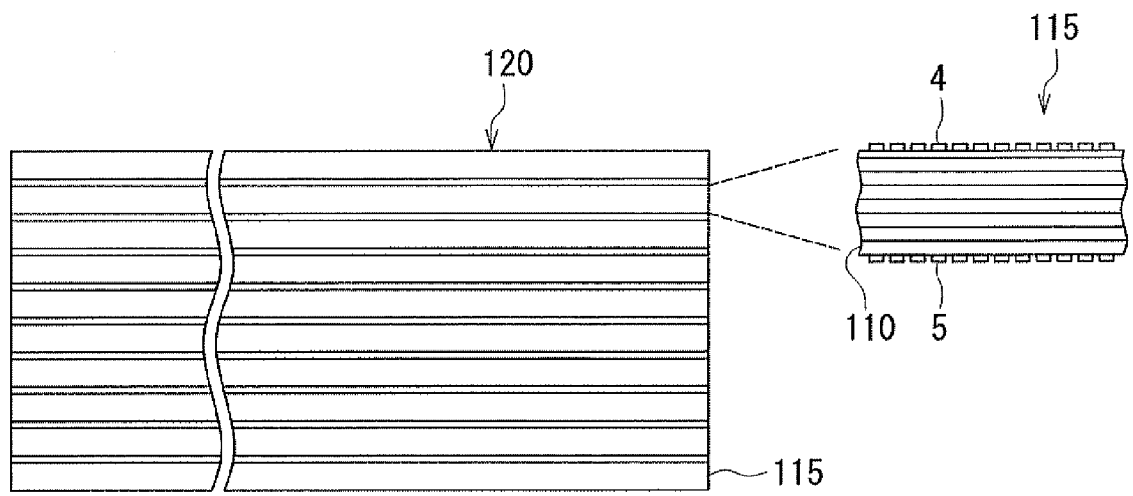
FIG. 27 is a side view of the second layered substructure of FIG. 26.

FIG. 26 and FIG. 27 show a step that follows the step shown in FIG. 25. In this step, a plurality of first layered substructures 115 are stacked and every two vertically adjacent first layered substructures 115 are bonded to each other to thereby fabricate a second layered substructure 120. FIG. 26 and FIG. 27 show an example where ten first layered substructures 115 are stacked to fabricate the second layered substructure 120. Every two vertically adjacent first layered substructures 115 are bonded to each other with an adhesive so as to be easily detachable. In this example, as shown in FIG. 27, the second layered substructure 120 includes ten first layered substructures 115 stacked, each of the first layered substructures 115 including eight substructures 110 stacked. That is, the second layered substructure 120 includes 80 substructures 110 stacked. Suppose that each individual substructure 110 has a thickness of 50 μm. Ignoring the thickness of the adhesive that bonds every two vertically adjacent substructures 110 to each other and the thickness of the adhesive that bonds every two vertically adjacent first layered substructures 115 to each other, the second layered substructure 120 has a thickness of 50 μm×80, i.e., 4 mm.

Figure 28:
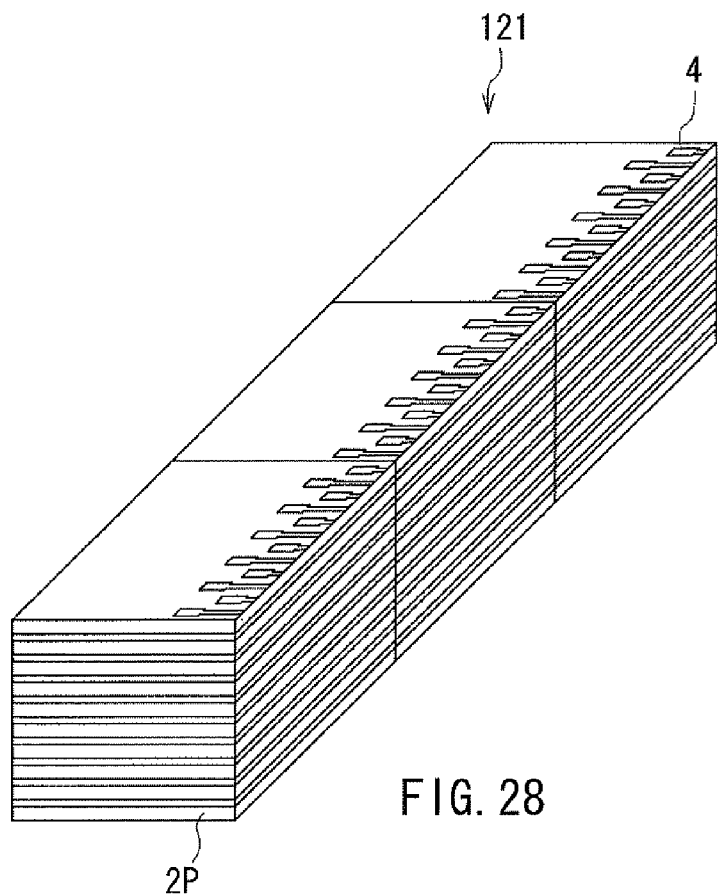
FIG. 28 is a perspective view showing a first example of a block obtained by cutting the second layered substructure.
Figure 29:
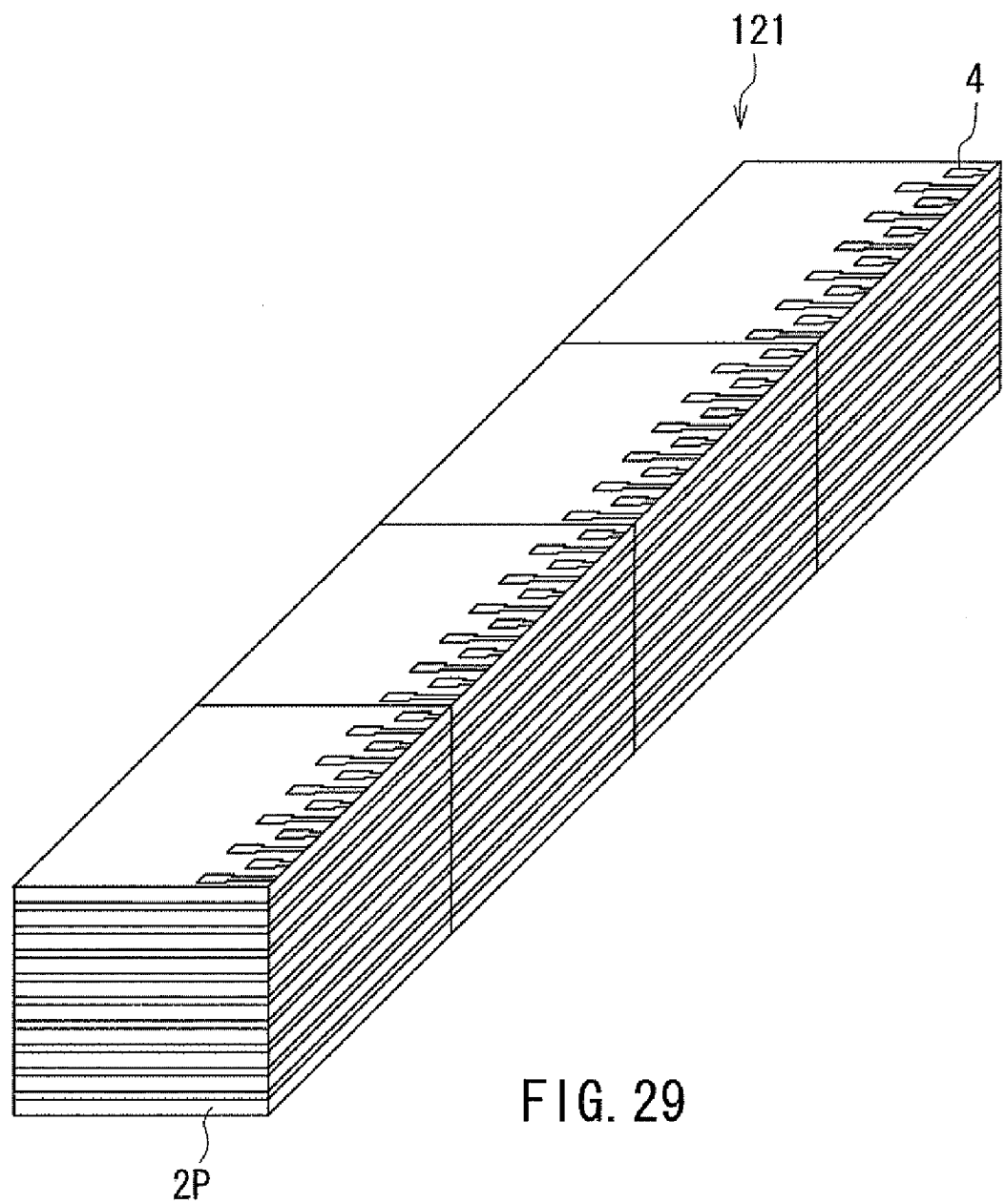
FIG. 29 is a perspective view showing a second example of a block obtained by cutting the second layered substructure.
Figure 30:
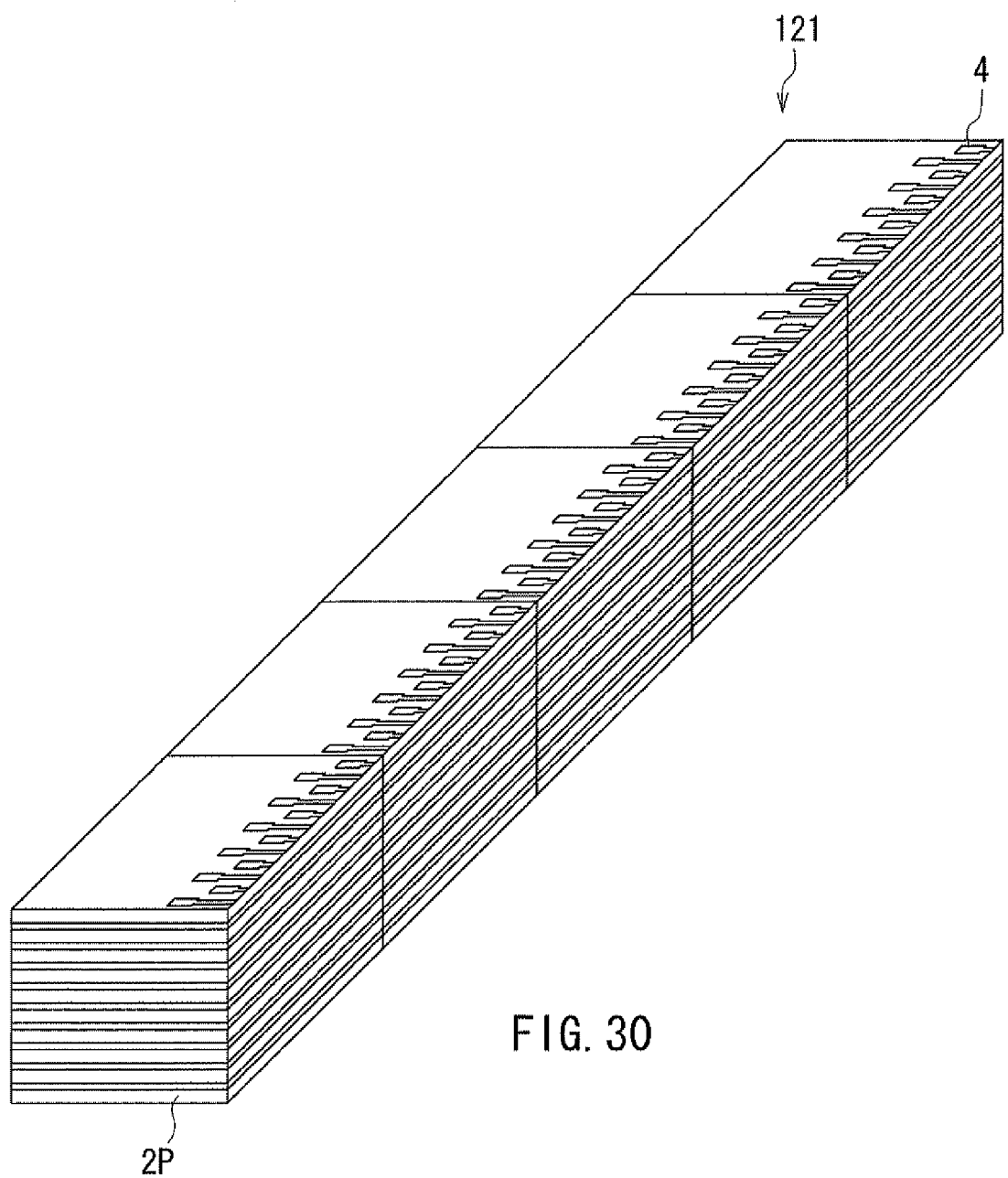
FIG. 30 is a perspective view showing a third example of a block obtained by cutting the second layered substructure.

FIG. 28 to FIG. 30 show a step that follows the step shown in FIG. 26 and FIG. 27. This step forms a plurality of structures each of which includes at least one main-body-forming portion. The main-body-forming portion is to be the main body 2. Each structure may be a main body 2 that is not yet provided with the wiring 3, or a block that includes a plurality of pre-separation main bodies 2P as a plurality of main-body-forming portions. Here, a description will be given of the case of forming a plurality of blocks as the plurality of structures. In the step of forming the plurality of structures, a plurality of blocks 121 are formed by cutting the second layered substructure 121. Each block 121 includes, as a plurality of main-body-forming portions, a plurality of pre-separation main bodies 2P that are arranged in each of the direction of stacking of the substructures 110 and a direction orthogonal thereto. FIG. 28 to FIG. 30 show first to third examples of the block 121, respectively.

In the first example of the block 121 shown in FIG. 28, ten pre-separation main bodies 2P are arranged in the direction of stacking of the first layered substructures 115, and three are arranged in the direction orthogonal to the direction of stacking of the first layered substructures 115. In this example, the block 121 includes 30 pre-separation main bodies 2P.

In the second example of the block 121 shown in FIG. 29, ten pre-separation main bodies 2P are arranged in the direction of stacking of the first layered substructures 115, and four are arranged in the direction orthogonal to the direction of stacking of the first layered substructures 115. In this example, the block 121 includes 40 pre-separation main bodies 2P.

In the third example of the block 121 shown in FIG. 30, ten pre-separation main bodies 2P are arranged in the direction of stacking of the first layered substructures 115, and five are arranged in the direction orthogonal to the direction of stacking of the first layered substructures 115. In this example, the block 121 includes 50 pre-separation main bodies 2P.

Figure 31:
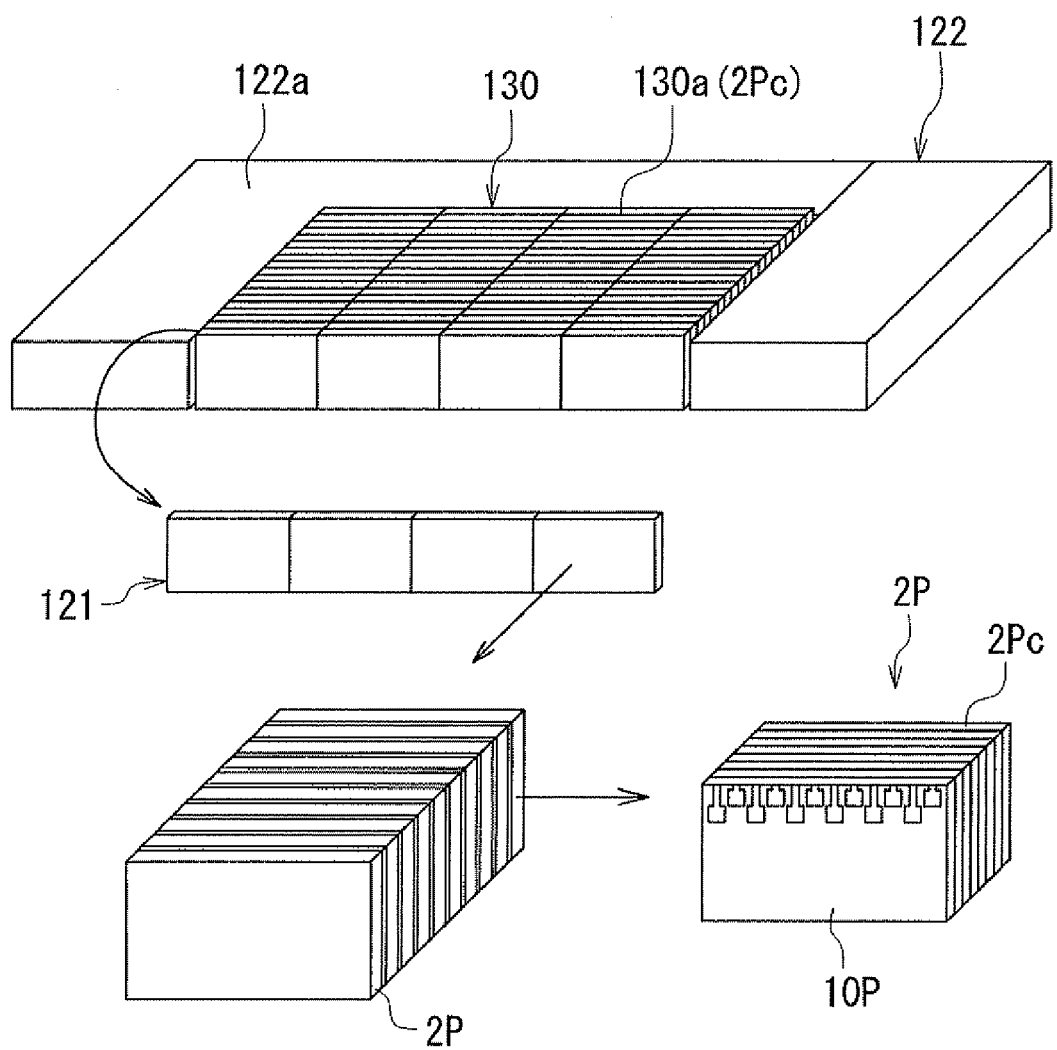
FIG. 31 is an explanatory diagram showing a step that follows the step shown in FIG. 28 to FIG. 30.
Figure 32:
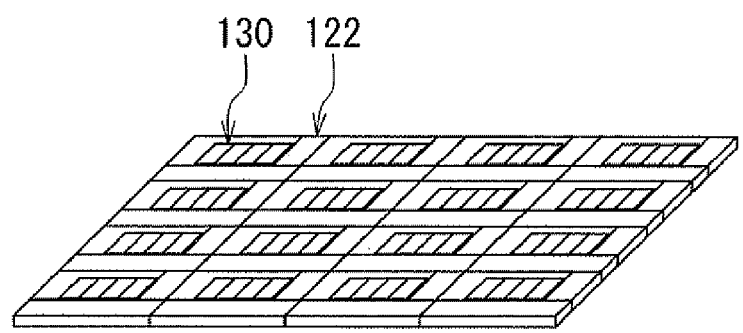
FIG. 32 is a perspective view showing a plurality of block assemblies arranged in a step that follows the step shown in FIG. 31.

In the present embodiment, next performed is the step of surrounding the plurality of structures, i.e., the plurality of blocks 121, with a jig and thereby aligning the structures. With reference to FIG. 31 and FIG. 32, a description will now be given of an example where a plurality of blocks 121 shown in FIG. 29 are surrounded with a jig and thereby aligned.

FIG. 31 shows a step that follows the step shown in FIG. 28 to FIG. 30. In the step of aligning the plurality of structures, a jig 122 that consists of a plurality of portions and has a top surface 122a is used to arrange two or more blocks 121 to form a block assembly 130. The plurality of portions of the jig 122 are combined to form a frame for surrounding the block assembly 130. Each of the pre-separation main bodies 2P has a pre-wiring surface 2Pc on which the wiring 3 is to be formed later. All the pre-separation main bodies 2P included in the block assembly 130 are arranged so that their respective pre-wiring surfaces 2Pc face toward the same direction, i.e., upward. The block assembly 130 has a top surface 130a that includes the pre-wiring surfaces 2Pc of all the pre-separation main bodies 2P included in the block assembly 130. The top surface 122a of the jig 122 is slightly lower in level than the top surface 130a (pre-wiring surfaces 2Pc) of the block assembly 130. FIG. 31 shows an example where 19 blocks 121 shown in FIG. 29 are arranged to form the block assembly 130. In this example, the block assembly 130 includes 19 blocks 121, each block 121 includes 40 pre-separation main bodies 2P, and each pre-separation main body 2P includes 8 preliminary layer portions 10P. That is, the block assembly 130 includes 19×40, i.e., 760 pre-separation main bodies 2P, and 19×40×8, i.e., 6080 preliminary layer portions 10P.

FIG. 32 shows a step that follows the step shown in FIG. 31. In this step, a plurality of block assemblies 130 are arranged in one plane by using the jig 122. Here, the plurality of block assemblies 130 are arranged to be partitioned from each other by the jig 122. All the pre-separation main bodies 2P included in the plurality of block assemblies 130 are arranged so that their respective pre-wiring surfaces 2Pc face toward the same direction, i.e., upward. FIG. 32 shows an example where 16 block assemblies 130 are arranged in one plane. In such a case, the 16 block assemblies 130 include 760×16, i.e., 12160 pre-separation main bodies 2P, and 6080×16, i.e., 97280 preliminary layer portions 10P.

Figure 33:
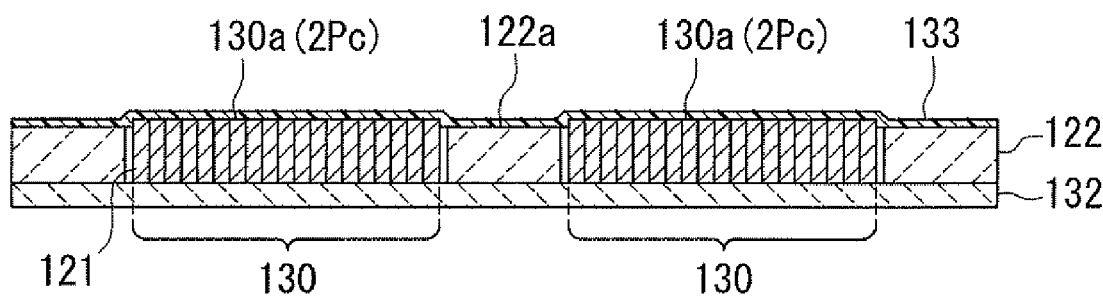
FIG. 33 is a cross-sectional view showing a step of the process for forming the wiring in the embodiment of the invention.

In the present embodiment, next performed is the step of forming a resin layer that covers the jig 122 and the plurality of structures. With reference to FIG. 33, a description will now be given of an example of forming a resin layer that covers all the blocks 121 included in the plurality of block assemblies 130 that are arranged as shown in FIG. 32.

FIG. 33 shows a step that follows the step shown in FIG. 32. In the step of forming the resin layer, first, the jig 122 and the plurality of block assemblies 130 shown in FIG. 32 are placed on a flat top surface of a jig 132. The plurality of block assemblies 130 are thereby arranged in one plane. In this state, the top surface 122a of the jig 122 is slightly lower in level than the top surfaces 130a (pre-wiring surfaces 2Pc) of the block assemblies 130.

In the step of forming the resin layer, next, the resin layer 133 covering the jig 122 and the plurality of block assemblies 130 is formed using a resin film. Typically, the resin film is also called a dry film. An example of the resin film is a dry film resist.

Figure 34:
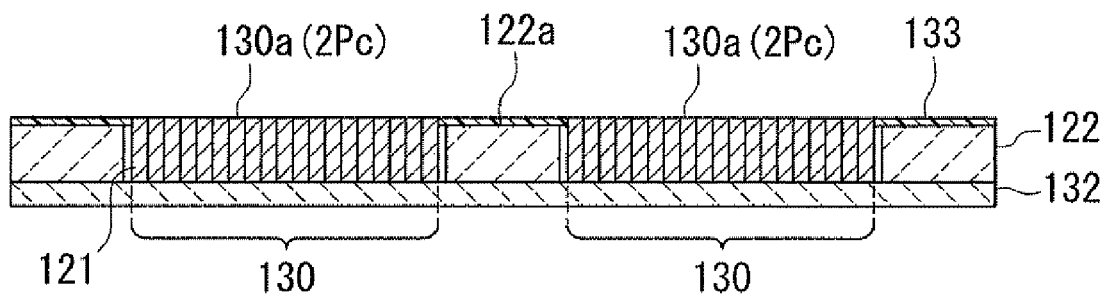
FIG. 34 is a cross-sectional view showing a step that follows the step shown in FIG. 33.

FIG. 34 shows a step that follows the step shown in FIG. 33. In this step, the resin layer 133 is polished by, for example, CMP, until the top surfaces 130a of the plurality of block assemblies 130 are exposed. The top surfaces 130a and the top surface of the resin layer 133 are thereby flattened. This flattens the top surface of the portion of the resin layer 133 that remains on the top surface 122a of the jig 122 and the pre-wiring surfaces 2Pc of all the pre-separation main bodies 2P included in the plurality of block assemblies 130.

In the present embodiment, after the top surfaces 130a of the plurality of block assemblies 130 and the top surface of the resin layer 133 are flattened as shown in FIG. 34, the wiring 3 is formed simultaneously on the pre-wiring surfaces 2Pc of all the pre-separation main bodies 2P included in the plurality of block assemblies 130 that are arranged as shown in FIG. 32. The step of forming the wiring 3 will now be described with reference to FIG. 35 to FIG. 37.

Figure 35:
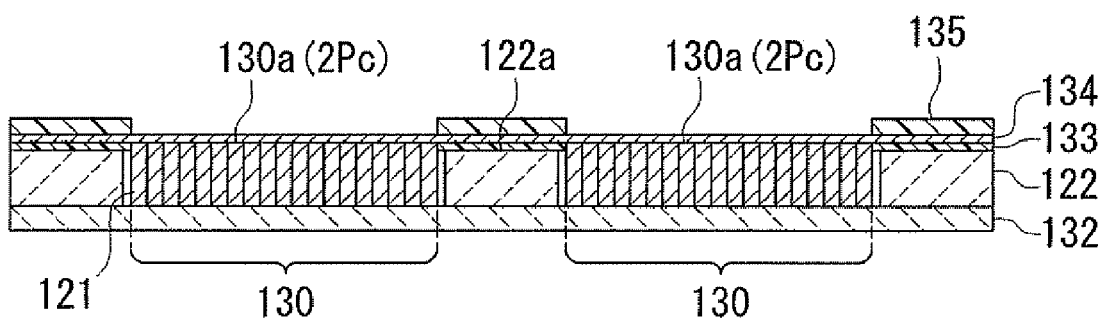
FIG. 35 is a cross-sectional view showing a step that follows the step shown in FIG. 34.

FIG. 35 shows a step that follows the step shown in FIG. 34. In this step, first, a seed layer 134 for plating is formed over the top surfaces 130a of the plurality of block assemblies 130 and the top surface of the resin layer 133. Next, a photoresist layer is formed on the seed layer 134. The photoresist layer is then patterned by photolithography to thereby form a frame 135. The frame 135 has a plurality of openings in which a plurality of units of wiring 3 corresponding to the plurality of pre-separation main bodies 2P are to be accommodated later. Although not shown in FIG. 35, the frame 135 includes a plurality of portions located above the respective pre-wiring surfaces 2Pc of all the pre-separation main bodies 2P included in the plurality of block assemblies 130. These plurality of portions have the respective openings to accommodate the wiring 3 later.

Figure 36:
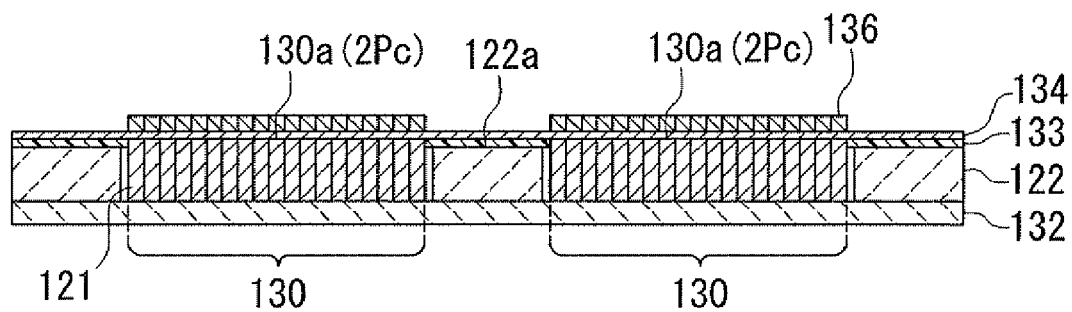
FIG. 36 is a cross-sectional view showing a step that follows the step shown in FIG. 35.

FIG. 36 shows a step that follows the step shown in FIG. 35. In this step, first, a plating layer 136 that is intended to constitute part of the wiring 3 is formed in each of the openings of the frame 135 by plating. Next, the frame 135 is removed. For the sake of convenience, FIG. 36 shows the plating layer 136 in a rectangular shape for each block 121. Actually, however, the plating layer 136 is formed in a shape corresponding to the wiring 3 for each pre-separation main body 2P.

Figure 37:
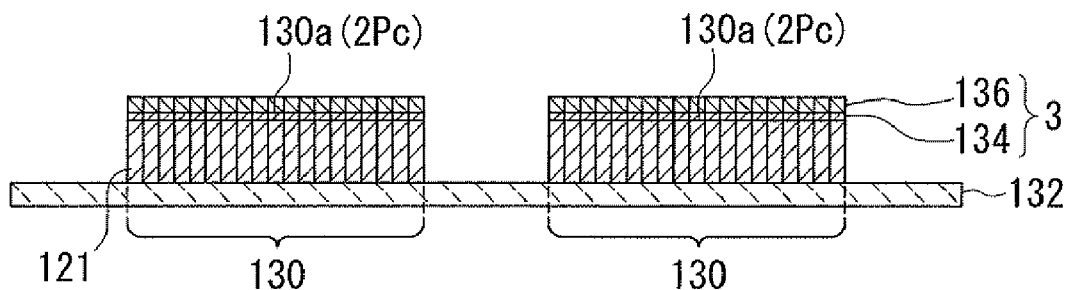
FIG. 37 is a cross-sectional view showing a step that follows the step shown in FIG. 36.

FIG. 37 shows a step that follows the step shown in FIG. 36. In this step, first, portions of the seed layer 134 other than those lying under the plating layers 136 are removed by etching. The wiring 3 is thus formed by the plating layers 136 and the remaining portions of the seed layer 134 under the plating layers 136. The wiring 3 is formed on each of the pre-separation main bodies 2P. Next, the jig 122 and the resin layer 133 remaining on the jig 122 are removed.

Figure 38:
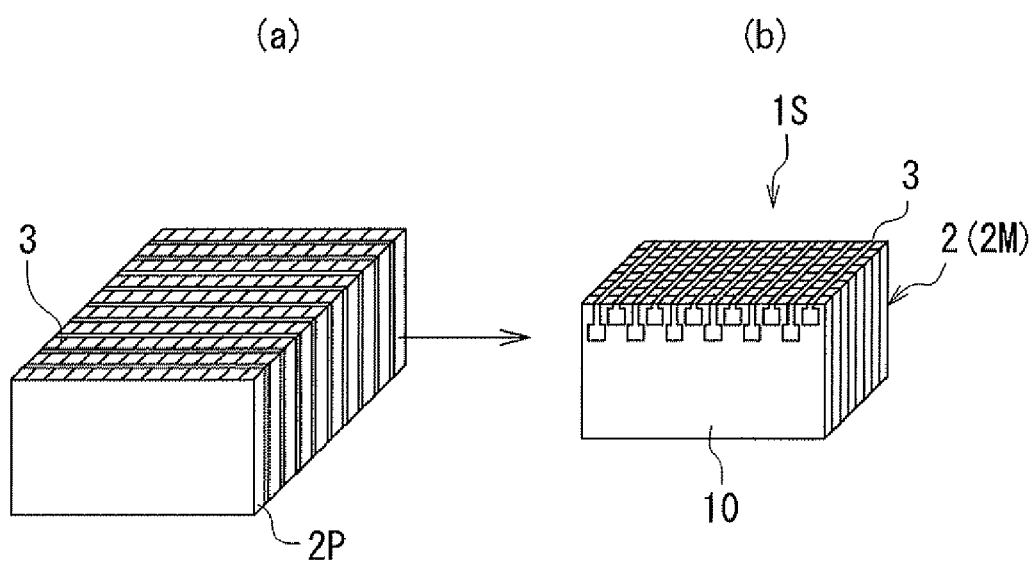
FIG. 38 is an explanatory diagram showing a step that follows the step shown in FIG. 37.

The process for fabricating a subpackage then proceeds to the step of separating the plurality of pre-separation main bodies 2P each provided with the wiring 3 from each other so as to form a plurality of subpackages. This step will be described with reference to FIG. 38. In the step, first, the block 121 is cut at the positions of the boundaries between every two pre-separation main bodies 2P that are adjacent to each other in the direction orthogonal to the direction of stacking of the pre-separation main bodies 2P. This produces a plurality of stacks shown in portion (a) of FIG. 38. Each of the stacks includes a plurality of pre-separation main bodies 2P stacked. In each of the stacks, every two adjacent pre-separation main bodies 2P are easily detachably bonded to each other by the adhesive used to bond every two vertically adjacent first layered substructures 115 when fabricating the second layered substructure 120 in the step of FIG. 26 and FIG. 27. Next, the plurality of pre-separation main bodies 2P included in the stack shown in portion (a) of FIG. 38 are separated from each other. This makes the pre-separation main bodies 2P into main bodies 2, whereby a plurality of subpackages 1S, each of which includes the main body 2 and the wiring 3, are formed. Portion (b) of FIG. 38 shows one of the subpackages 1S.

A plurality of subpackages 1S are thus fabricated through the series of steps that have been described with reference to FIG. 9 to FIG. 38. So far the description has dealt with the case where a plurality of subpackages (layered chip packages) 1S each including eight layer portions 10 are fabricated by using the first layered substructure 115 that includes eight stacked substructures 110 shown in FIG. 25. In the present embodiment, however, the number of the substructures 110 to be included in the first layered substructure 115 can be changed to fabricate a plurality of types of subpackages (layered chip packages) 1S with different numbers of layer portions 10. Moreover, in the present embodiment, a structure composed of a single substructure 110 with the plurality of terminals 5 formed on the bottom surface of the substructure 110 may be fabricated instead of the first layered substructure 115, and such a structure may be used instead of the first layered substructure 115 to fabricate a plurality of subpackages 1S through the series of steps described with reference to FIG. 26 to FIG. 38. In this case, each of the subpackages 1S includes only a single layer portion.

Figure 39:
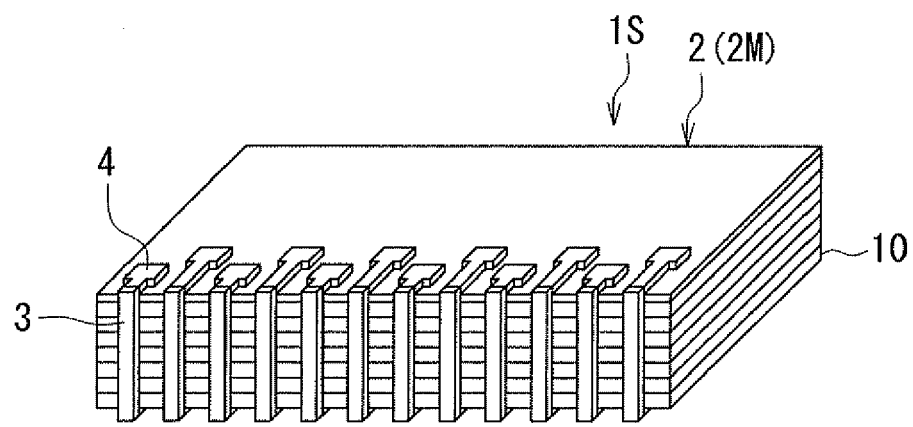
FIG. 39 is a perspective view showing a subpackage that includes eight layer portions.
Figure 40:
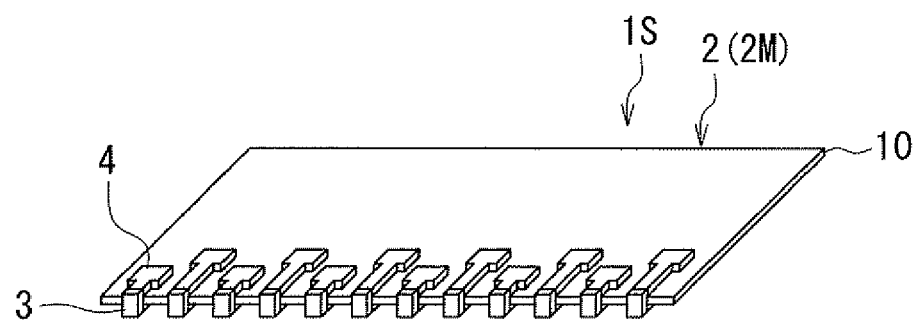
FIG. 40 is a perspective view showing a subpackage that includes only a single layer portion.
Figure 41:
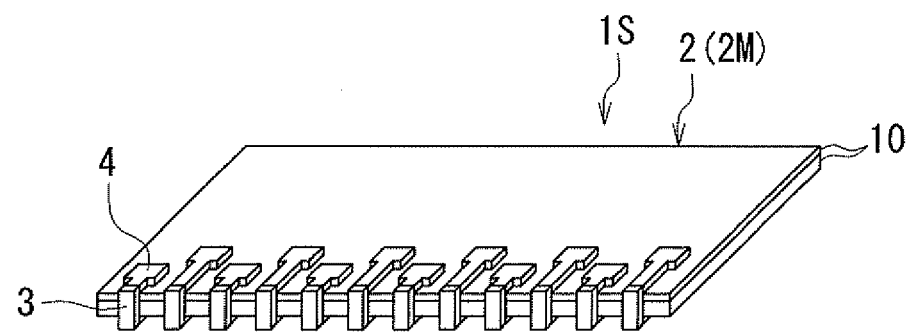
FIG. 41 is a perspective view showing a subpackage that includes two layer portions.
Figure 42:
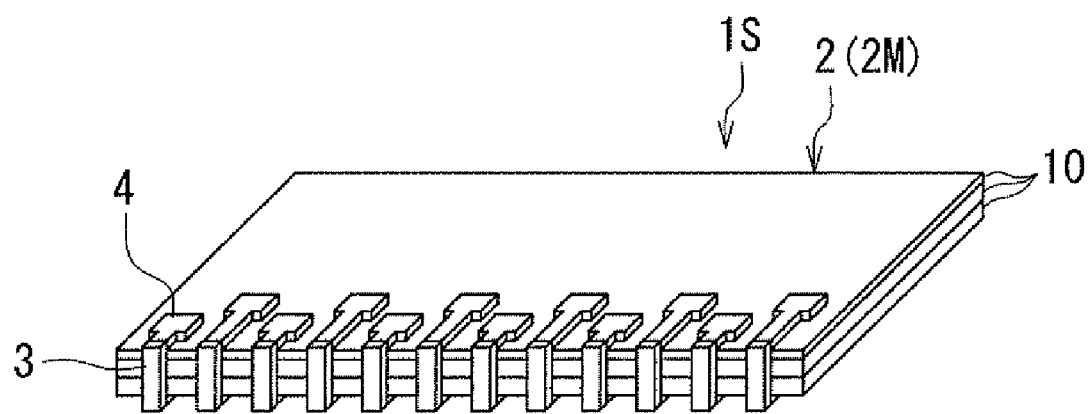
FIG. 42 is a perspective view showing a subpackage that includes three layer portions.
Figure 43:
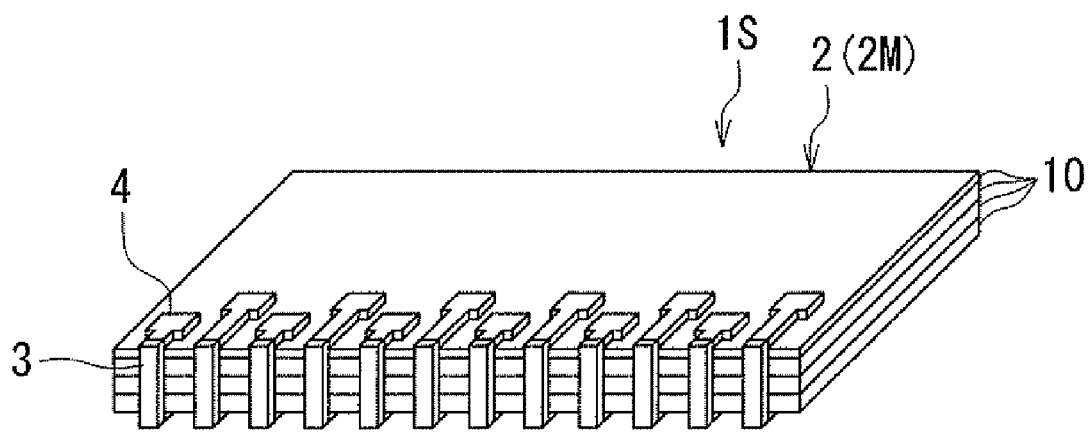
FIG. 43 is a perspective view showing a subpackage that includes four layer portions.

FIG. 39 to FIG. 43 show examples of a plurality of types of subpackages having different numbers of layer portions 10 that can be fabricated according to the present embodiment. FIG. 39 shows a subpackage 1S that includes eight layer portions 10. FIG. 40 shows a subpackage 1S that includes only a single layer portion 10. FIG. 41 shows a subpackage 1S that includes two layer portions 10. FIG. 42 shows a subpackage 1S that includes three layer portions 10. FIG. 43 shows a subpackage 1S that includes four layer portions 10.

The subpackage 1S of the present embodiment has the wiring 3 disposed on at least one of the side surfaces of the main body 2. The main body 2 has at least either the first terminals 4 which are disposed on the top surface 2Ma of the main part 2M or the second terminals 5 which are disposed on the bottom surface 2Mb of the main part 2M. The first terminals 4 and the second terminals 5 are both electrically connected to the wiring 3. With the subpackage 1S of such a configuration, it is easy to establish electrical connection between a plurality of subpackages 1S. For example, according to the present embodiment, it is possible to establish electrical connection between two or more subpackages 1S by stacking the two or more subpackages 1S on each other and connecting the second terminals 5 of the main body 2 of the upper subpackage 1S to the first terminals 4 of the main body 2 of the lower subpackage 1S.

According to the present embodiment, a plurality of subpackages 1S whose respective main bodies 2 each have the second terminals 5 may be mounted on a wiring board, and the wiring of the wiring board and the second terminals 5 of the subpackages 1S may be used to establish electrical connection between the plurality of subpackages 1S. In such a case, if the respective main bodies 2 of the subpackages 1S mounted on a single wiring board each have the first terminals 4, the first terminals 4 of one of the subpackages 1S may be electrically connected to the first terminals 4 of another one of the subpackages 1S by wire bonding, for example.

Figure 44:
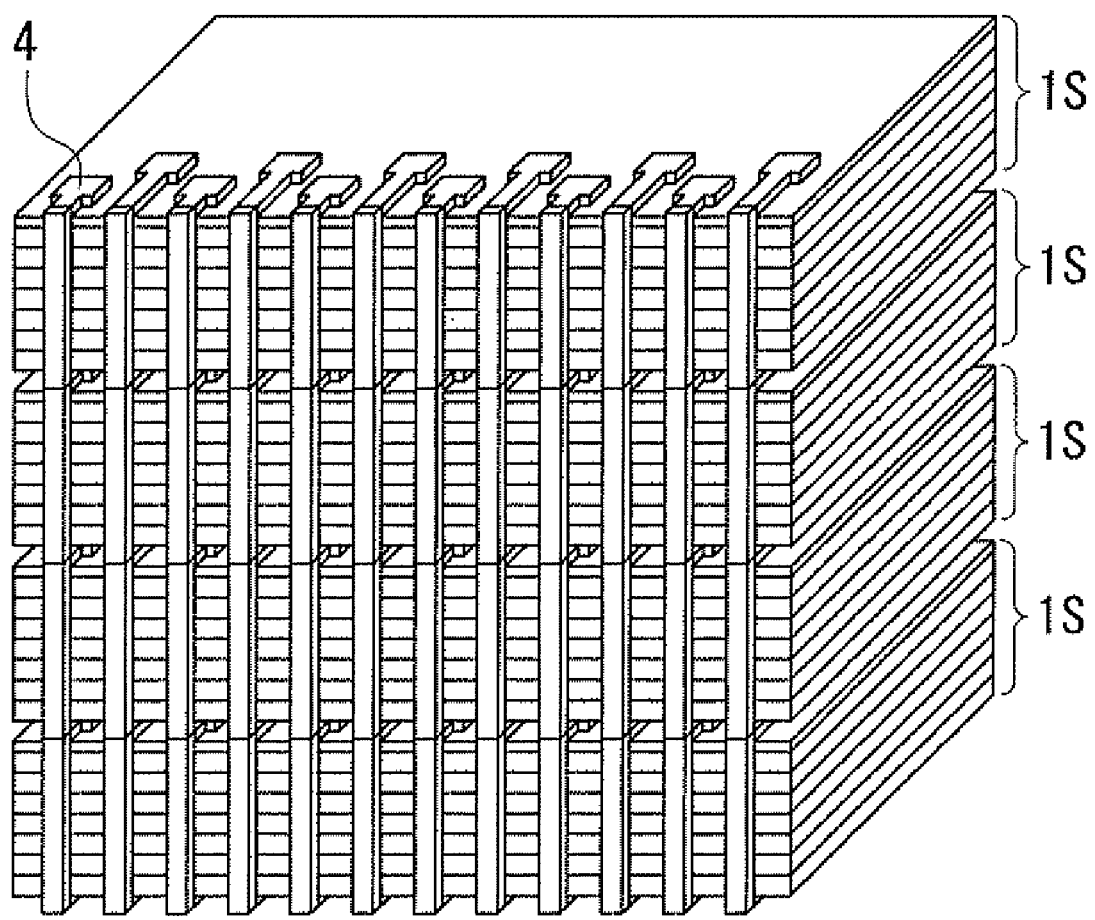
FIG. 44 is a perspective view showing four subpackages stacked.

The subpackage 1S is preferably such one that the main body 2 has both the first terminals 4 and the second terminals 5. With such a subpackage 1S, it is possible to stack three or more subpackages 1S and establish electrical connection therebetween. FIG. 44 shows an example where four subpackages 1S are stacked and electrically connected to each other, the respective main bodies 2 of the four subpackages 1S each having both the first terminals 4 and the second terminals 5.

Figure 45:
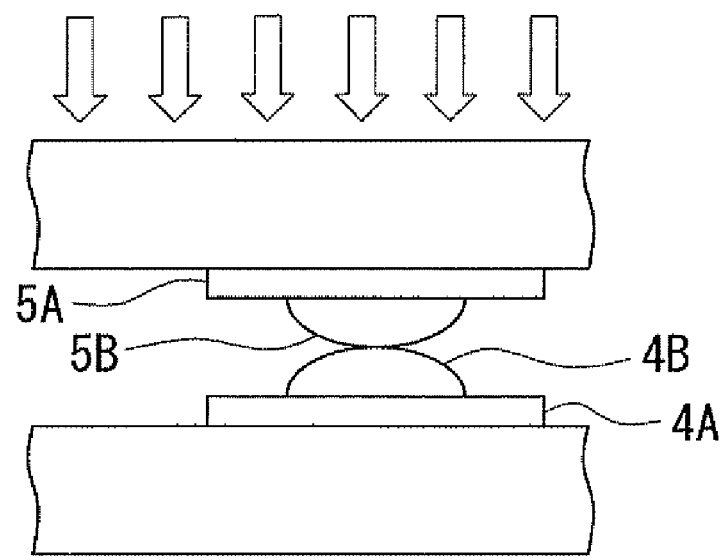
FIG. 45 is a side view showing connecting parts of the terminals of two vertically adjacent subpackages.
Figure 46:
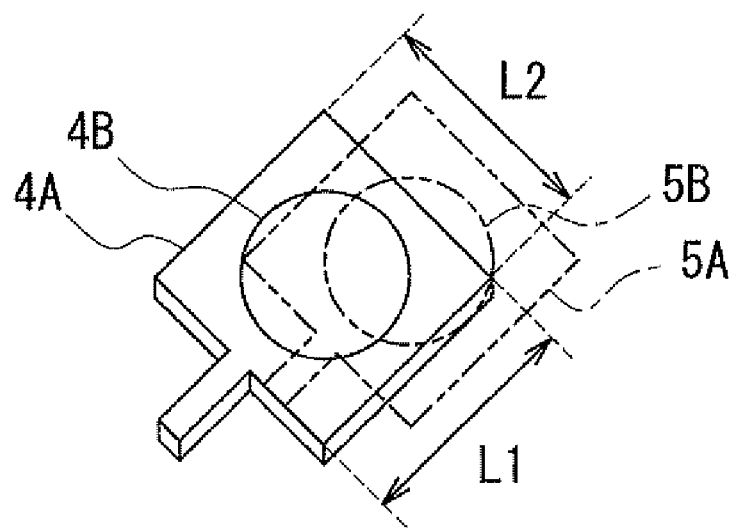
FIG. 46 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S. This advantageous effect will now be described with reference to FIG. 45 and FIG. 46. FIG. 45 is a side view showing connecting parts of the terminals of two vertically adjacent subpackages 1S. FIG. 46 is an explanatory diagram for explaining misalignment between the terminals of two vertically adjacent subpackages 1S.

In the example shown in FIG. 45 and FIG. 46, the terminal 4 includes a rectangular conductor pad 4A and a solder bump 4B formed on the conductor pad 4A. Similarly, the terminal 5 includes a rectangular conductor pad 5A and a solder bump 5B formed on the conductor pad 5A. Here, lengths of two orthogonal sides of the conductor pad 4A will be represented by L1 and L2. L1 and L2 are both 30 to 60 μm, for example. The conductor pad 5A has the same shape as that of the conductor pad 4A.

In the example shown in FIG. 45, the corresponding terminals 4 and 5 of the two vertically adjacent subpackages 1S are electrically connected in the following way. The solder bumps 4B and 5B of the corresponding terminals 4 and 5 are put into contact with each other. By applying heat and pressure, the solder bumps 4B and 5B are melted, and then cured to bond the terminals 4 and 5.

FIG. 46 shows a state where the terminals 4 and 5 are out of alignment. The state where the terminals 4 and 5 are out of alignment refers to the state where the edges of the conductor pad 4A and those of the conductor pad 5A do not coincide in position with each other when viewed in a direction perpendicular to the plane of the conductor pads 4A and 5A. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are each 30 to 60 μm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of an electronic component that includes a plurality of subpackages 1S stacked.

Figure 47:
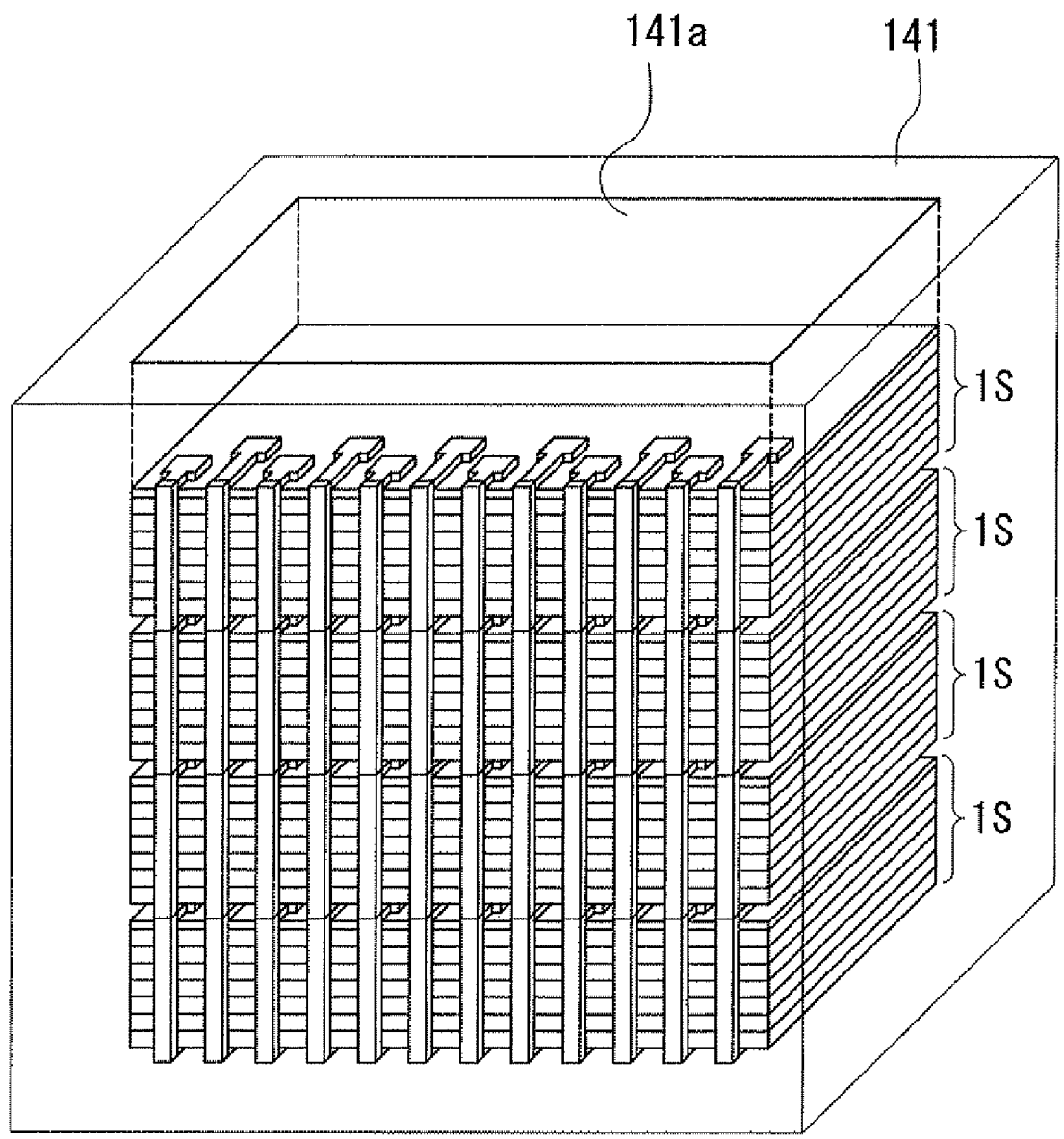
FIG. 47 is a perspective view showing an example of a method of manufacturing an electronic component that includes a plurality of subpackages stacked.

FIG. 47 shows an example of the method of manufacturing an electronic component that includes a plurality of subpackages 1S stacked. The method shown in FIG. 47 uses a heatproof container 141. The container 141 has an accommodating part 141a in which a plurality of subpackages 1S can be stacked and accommodated. The accommodating part 141a has such a size that the side surfaces of the subpackages 1S accommodated in the accommodating part 141a and the inner walls of the accommodating part 141 leave a slight gap therebetween. In this method, the plurality of subpackages 1S are stacked and accommodated in the accommodating part 141a of the container 141, and then the container 141 and the plurality of subpackages 1S are heated at temperatures at which the solder bumps 4B and 5B melt. This melts the solder bumps 4B and 5B of the terminals 4 and 5, whereby the terminals 4 and 5 of every two vertically adjacent subpackages 1S are bonded to each other. According to this method, it is possible to perform the alignment between the plurality of subpackages 1S easily by stacking and accommodating the subpackages 1S in the accommodating part 141a of the container 141. This makes it easy to manufacture an electronic component that includes a plurality of subpackages 1S stacked.

The composite layered chip package 1 of the present embodiment includes a plurality of subpackages 1S stacked. For any two vertically adjacent subpackages 1S of the composite layered package 1, the plurality of second terminals 5 of the main body 2 of the upper subpackage 1S are electrically connected to the plurality of first terminals 4 of the main body 2 of the lower subpackage 1S. The main part 2M of the main body 2 of each of the plurality of subpackages 1S includes at least one first-type layer portion 10A. The main part 2M of the main body 2 of at least one of the plurality of subpackages 1S further includes at least one second-type layer portion 10B. The first-type layer portion 10A includes a conforming semiconductor chip 30. The second-type layer portion 10B includes a defective semiconductor chip 30. The first-type layer portion 10A includes a plurality of electrodes 32 that are electrically connected to the semiconductor chip 30 and that each have an end face located in the at least one of the side surfaces of the main body 2 on which the wiring 3 is disposed, whereas the second-type layer portion 10B does not include the electrodes 32.

The method of manufacturing the composite layered chip package 1 of the present embodiment includes the steps of: fabricating a plurality of subpackages 1S; and stacking the plurality of subpackages 1S and electrically connecting, for any two vertically adjacent subpackages 1S, the plurality of second terminals 5 of the upper subpackage 1S to the plurality of first terminals 4 of the lower subpackage 1S.

The step of fabricating a plurality of subpackages 1S includes, as a series of steps for forming each subpackage 1S, the step of fabricating at least one substructure 110 that includes an array of a plurality of preliminary layer portions 10P, each of the preliminary layer portions 10P being intended to become any one of the layer portions 10 included in the main part 2M, the substructure 110 being intended to be cut later at the position of the boundary between every adjacent preliminary layer portions 10P; and the step of fabricating the subpackage 1S by using the at least one substructure 110. The step of fabricating the at least one substructure 110 includes the steps of: fabricating a pre-substructure wafer 101 including an array of a plurality of pre-semiconductor-chip portions 30P that are intended to become individual semiconductor chips 30; distinguishing the plurality of pre-semiconductor-chip portions 30P included in the pre-substructure wafer 101 into normally functioning pre-semiconductor-chip portions 30P and malfunctioning pre-semiconductor-chip portions 30P; and forming the plurality of electrodes 32 in the normally functioning pre-semiconductor-chip portions 30P while not forming the plurality of electrodes 32 in the malfunctioning pre-semiconductor-chip portions 30P, so as to make the pre-substructure wafer 101 into the substructure 110.

The step of forming the plurality of electrodes 32 includes the steps of: forming a photoresist layer 108P that is intended to be used for forming the plurality of electrodes 32 and includes a plurality of areas corresponding to all the pre-semiconductor-chip portions 30P; forming a frame 108 by patterning the photoresist layer 108P by photolithography, the frame 108 having a plurality of openings 108a that are intended to accommodate the plurality of electrodes 32 later; and forming the plurality of electrodes 32 in the plurality of openings 108a of the frame 108.

According to the present embodiment, a package including a plurality of semiconductor chips 30 stacked can be easily implemented by stacking a plurality of subpackages 1S, the package being capable of providing, even if it includes a defective semiconductor chip 30, the same functions as those for the case where no defective semiconductor chip 30 is included. This advantageous effect will now be described in detail.

By way of example, a description will be given of a case where a layered chip package that includes eight conforming semiconductor chips 30 is required. In this case, if there is fabricated a layered chip package including only eight semiconductor chips 30 and if one or more of the eight semiconductor chips 30 are defective, simply disabling the defective semiconductor chip(s) 30 cannot make the layered chip package meet the above requirement. The defective semiconductor chip(s) 30 can be replaced with conforming semiconductor chip(s) 30 to remake the layered chip package, but this raises the manufacturing cost for the layered chip package.

According to the present embodiment, if, for example, a first subpackage 1S includes eight semiconductor chips 30 and one or more of the eight semiconductor chips 30 are defective, a second subpackage 1S having as many conforming semiconductor chip(s) 30 as the foregoing defective semiconductor chip(s) 30 can be stacked with the first subpackage 1S to constitute a composite layered chip package 1. The resulting composite layered chip package 1 provides the same functions as those of a layered chip package that includes eight conforming semiconductor chips 30 and no defective semiconductor chip 30.

For example, in the composite layered chip package 1 shown in FIG. 1 to FIG. 6, the subpackage 1A includes six first-type layer portions 10A and two second-type layer portions 10B, while the subpackage 1B includes two first-type layer portions 10A. The composite layered chip package 1 thus includes eight first-type layer portions 10A and two second-type layer portions 10B. Since the two second-type layer portions 10B do not include the plurality of electrodes 32 connected to the wiring 3, the use of the two defective semiconductor chips 30 included in the two second-type layer portions 10B is disabled. The composite layered chip package 1 shown in FIG. 1 to FIG. 6 therefore provides the same functions as those of a layered chip package that includes eight conforming semiconductor chips 30 stacked and no defective semiconductor chip 30.

As previously described, according to the present embodiment, it is possible to easily stack a plurality of subpackages 1S and electrically connect them to each other. Consequently, according to the present embodiment, a composite layered chip package 1 including a plurality of semiconductor chips 30 stacked can be easily implemented by stacking a plurality of subpackages 1S, the composite layered chip package 1 being capable of providing, even if it includes a defective semiconductor chip 30, the same functions as those for the case where no defective semiconductor chip 30 is included.

Figure 48:
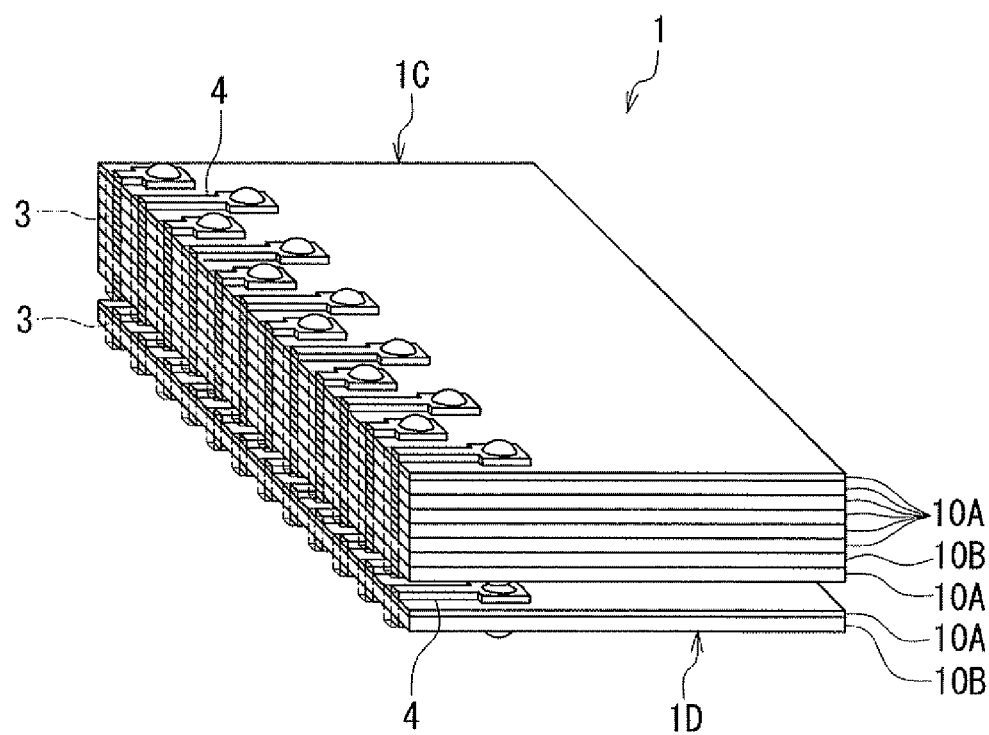
FIG. 48 is a perspective view showing a first modification example of the composite layered chip package of the embodiment of the invention.
Figure 49:
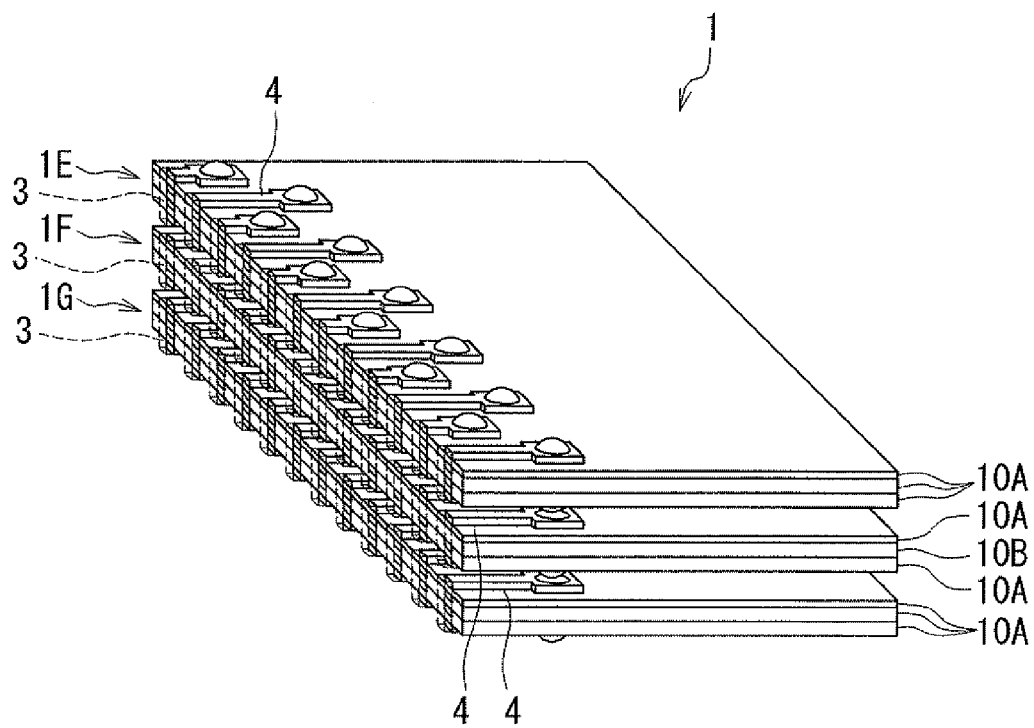
FIG. 49 is perspective view showing a second modification example of the composite layered chip package of the embodiment of the invention.

In the present embodiment, a composite layered chip package 1 including a required number of conforming semiconductor chips 30 can be formed by combining a plurality of subpackages 1S in various configurations. FIG. 48 and FIG. 49 show examples where a composite layered chip package 1 including eight conforming semiconductor chips 30 is formed by combining a plurality of subpackages 1S in different configurations from the configuration of the example of FIG. 1 to FIG. 6.

The composite layered chip package 1 shown in FIG. 48 includes two subpackages 1C and 1D that are stacked and electrically connected to each other. The subpackage 1C includes seven first-type layer portions 10A and a single second-type layer portion 10B. The subpackage 1D includes a single first-type layer portion 10A and a single second-type layer portion 10B. This composite layered chip package 1 thus includes eight first-type layer portions 10A and two second-type layer portions 10B.

The composite layered chip package 1 shown in FIG. 49 includes three subpackages 1E, 1F and 1G that are stacked and electrically connected to each other. The subpackage 1E includes three first-type layer portions 10A. The subpackage 1F includes two first-type layer portions 10A and a single second-type layer portion 10B. The subpackage 1G includes three first-type layer portions 10A. This composite layered chip package 1 thus includes eight first-type layer portions 10A and a single second-type layer portion 10B.

The composite layered chip package 1 shown in FIG. 48 and that shown in FIG. 49 each provide the same functions as those of a layered chip package that includes eight conforming semiconductor chips 30 stacked and no defective semiconductor chip 30.

Although not shown in the drawings, there are many configurations that can form a composite layered chip package 1 with eight conforming semiconductor chips 30 aside from the illustrated configurations. For example, a subpackage 1S that includes seven first-type layer portions 10A and a single second-type layer portion 10B may be combined with a subpackage 1S that includes only a single first-type layer portion 10A as its layer portion 10 as shown in FIG. 40. This also provides a composite layered chip package 1 with eight conforming semiconductor chips 30.

Suppose, in the present embodiment, that the plurality of semiconductor chips 30 included in the composite layered chip package 1 are memory chips with a capacity of N bits each (N is a natural number). Suppose also that the number of the first-type layer portions 10A included in the composite layered chip package 1, i.e., the number of conforming semiconductor chips 30 included in the composite layered chip package 1, is eight. In such a case, the composite layered chip package 1 can implement a memory of N bytes in capacity. Here, it is easy to recognize the capacities of the memory chips and the capacity of the memory to be implemented by the composite layered chip package 1. This advantageous effect is also obtainable when the number of the first-type layer portions 10 included in the composite layered chip package 1 is a multiple of 8.

If a layer portion 10 that includes a defective semiconductor chip 30 is also provided with the electrodes 32 that are electrically connected to the semiconductor chip 30 and that each have an end face located in the at least one of the side surfaces of the main body 2 on which the wiring 3 is disposed, there is established a connection between the electrodes 32 and the wiring 3. In such a case, the electrodes 32 connected to the defective semiconductor chip 30 can produce capacitances and inductances that are unnecessary for a device to be implemented by the subpackage 1S, such as a memory device, and/or produce a stray capacitance between themselves and other electrodes 32 connected to a conforming semiconductor chip 30. This hinders the acceleration of operation of the device such as a memory device.

In contrast, according to the present embodiment, as described above, the second-type layer portion 10B including a defective semiconductor chip 30 does not have the electrodes 32 that are electrically connected to the semiconductor chip 30 and that each have an end face located in the at least one of the side surfaces of the main body 2 on which the wiring 3 is disposed. Therefore, in the subpackage 1S, the second-type layer portion 10 which includes a defective semiconductor chip 30 can be regarded as merely an insulating layer. The present embodiment thus makes it possible to disable the use of a defective semiconductor chip 30 and reduce the problems resulting from wiring connected to the defective semiconductor chip 30.

Figure 50:
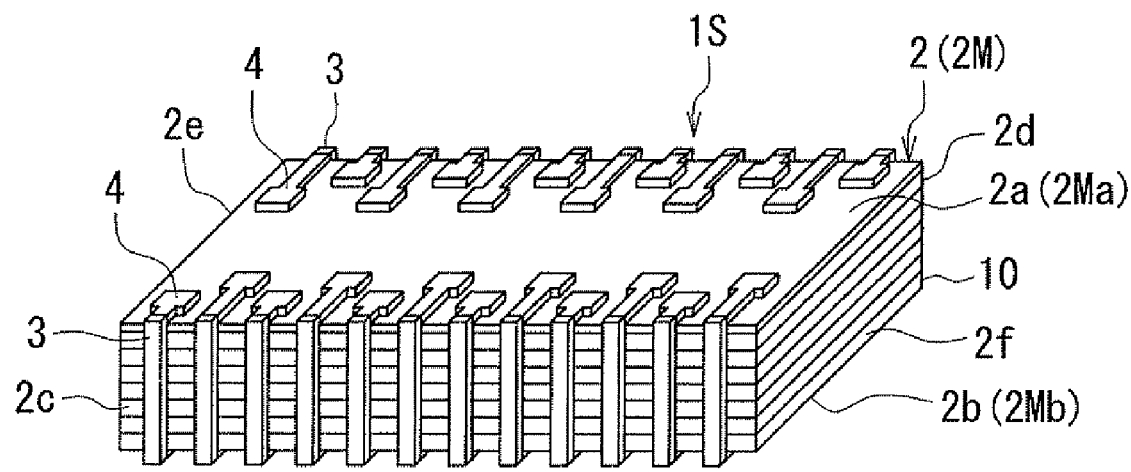
FIG. 50 is perspective view showing a first modification example of the layered chip package according to the embodiment of the invention.
Figure 51:
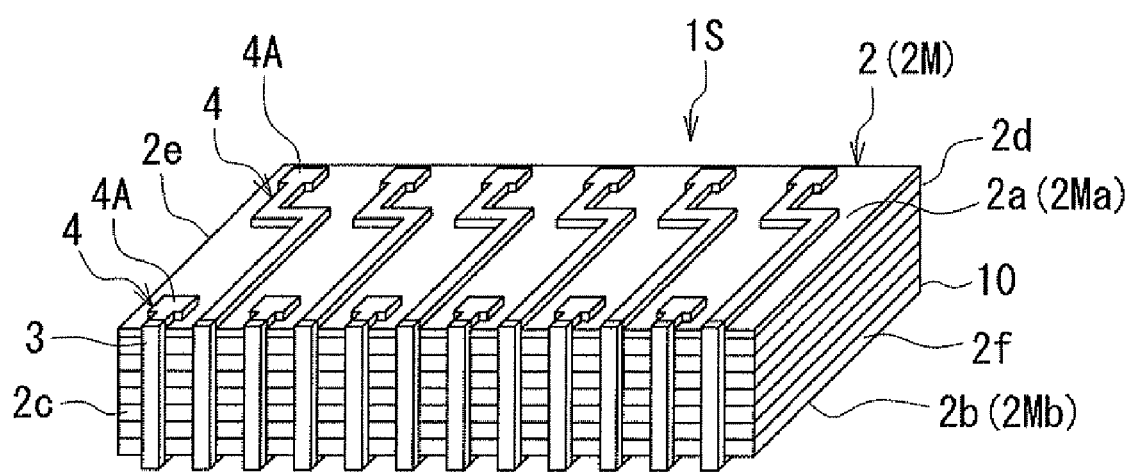
FIG. 51 is perspective view showing a second modification example of the layered chip package according to the embodiment of the invention.

Possible layouts of the wiring 3 and the terminals 4 and 5 in a subpackage 1S are not limited to the example shown in FIG. 1 to FIG. 6. FIG. 50 and FIG. 51 show examples of a subpackage 1S having the wiring 3 and the terminals 4 and 5 in a layout different from that of the example shown in FIG. 1 to FIG. 6.

In the subpackage 1S shown in FIG. 50, the wiring 3 is disposed on the two side surfaces 2c and 2d of the main body 2. The main body 2 of this subpackage 1S has a plurality of terminals 4. Some of the terminals 4 are disposed on an area of the top surface 2Ma of the main part 2M near the side surface 2c, and the other terminals 4 are disposed on an area of the top surface 2Ma near the side surface 2d. The terminals 4 disposed near the side surface 2c are electrically connected to the wiring 3 that is disposed on the side surface 2c. The terminals 4 disposed near the side surface 2d are electrically connected to the wiring 3 that is disposed on the side surface 2d. Although not shown in the diagram, the main body 2 further has a plurality of terminals 5. Some of the terminals 5 are disposed on an area of the bottom surface 2Mb of the main part 2M near the side surface 2c, and the other terminals 5 are disposed on an area of the bottom surface 2Mb near the side surface 2d. The terminals 5 disposed near the side surface 2c are electrically connected to the wiring 3 that is disposed on the side surface 2c. The terminals 5 disposed near the side surface 2d are electrically connected to the wiring 3 that is disposed on the side surface 2d.

In the subpackage 1S shown in FIG. 51, the wiring 3 is disposed on the side surface 2c of the main body 2. The main body 2 of this subpackage 1S has a plurality of terminals 4. Some of the terminals 4 have conductor pads 4A disposed on an area of the top surface 2Ma of the main part 2M near the side surface 2c, and are electrically connected to the wiring 3. The other terminals 4 have conductor pads 4A disposed on an area of the top surface 2Ma near the side surface 2d, and are electrically connected to the wiring 3. Although not shown in the diagram, the main body 2 further has a plurality of terminals 5. Some of the terminals 5 have conductor pads 5A disposed on an area of the bottom surface 2Mb of the main part 2M near the side surface 2c, and are electrically connected to the wiring 3. The other terminals 5 have conductor pads 5A disposed on an area of the bottom surface 2Mb near the side surfaces 2d, and are electrically connected to the wiring 3.

According to the present embodiment, in a layered chip package, i.e., a subpackage 1S including a plurality of semiconductor chips 30 stacked, the stacked semiconductor chips 30 are electrically connected to each other by the wiring 3 that is disposed on at least one of the side surfaces of the main body 2. Consequently, the present embodiment is free from the problems of the wire bonding method, that is, the problem that it is difficult to reduce the distance between electrodes so as to avoid contact between wires, and the problem that the high resistances of the wires hinder the acceleration of operation of the circuit.

As compared with the through electrode method, the present embodiment has the following advantages. First, the present embodiment does not require the formation of through electrodes in each chip and consequently does not require a large number of steps for forming through electrodes in each chip.

According to the present embodiment, electrical connection between the plurality of semiconductor chips 30 is established by the wiring 3 disposed on at least one of the side surfaces of the main body 2. The present embodiment thus provides higher reliability of electrical connection between chips as compared with the case where through electrodes are used to establish electrical connection between chips.

Furthermore, according to the present embodiment, it is possible to easily change the line width and thickness of the wiring 3. Consequently, it is possible to easily cope with future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between upper and lower chips in order to connect the through electrodes of the upper and lower chips to each other. In contrast, according to the present embodiment, electrical connection between the semiconductor chips 30 is established not at an interface between two vertically adjacent layer portions 10 but through the use of the wiring 3 disposed on at least one of the side surfaces of the main body 2. The alignment between the plurality of layer portions 10 therefore requires lower accuracy than that required for the alignment between a plurality of chips in the through electrode method.

In the present embodiment, the method of manufacturing the subpackage 1S including a plurality of semiconductor chips 30 stacked, i.e., the method of manufacturing the layered chip package, initially forms a plurality of blocks 121 each of which includes a plurality of pre-separation main bodies 2P. Each of the pre-separation main bodies 2P has the pre-wiring surface 2Pc. Next, the plurality of blocks 121 are surrounded with the jig 122 and thereby aligned so that their respective pre-wiring surfaces 2Pc face upward. The jig 122 has the top surface 122a that is slightly lower in level than the pre-wiring surfaces 2Pc. Next, the resin layer 133 covering the jig 122 and the plurality of blocks 121 is formed using a resin film. The resin layer 133 is then polished until the pre-wiring surfaces 2Pc are exposed, whereby the pre-wiring surfaces 2Pc and the top surface of the portion of the resin layer 133 that remains on the top surface 122a of the jig 122 are flattened. Next, the wiring 3 is formed simultaneously on the pre-wiring surfaces 2Pc of a plurality of pre-separation main bodies 2P included in the plurality of blocks 121. Next, the plurality of pre-separation main bodies 2P with the wiring 3 formed on the respective pre-wiring surfaces 2Pc are separated from each other so as to form a plurality of layered chip packages.

According to the method of manufacturing the layered chip package, the wiring 3 is formed simultaneously on the pre-wiring surfaces 2Pc of a plurality of pre-separation main bodies 2P included in a plurality of blocks 121. This makes it possible to simultaneously form a plurality of units of wiring 3 corresponding to a plurality of layered chip packages. Here, it is unnecessary to perform alignment between the plurality of pre-separation main bodies 2P included in each block 121. Consequently, according to this manufacturing method, a plurality of layered chip packages capable of being electrically connected to each other easily can be mass-produced at low cost in a short time.

Moreover, in the foregoing method of manufacturing the layered chip package, the top surface of the portion of the resin layer 133 that remains on the top surface 122a of the jig 122 and the pre-wiring surfaces 2Pc of all the pre-separation main bodies 2P included in a plurality of block assemblies 130 are flattened when forming the wiring 3. The manufacturing method therefore allows precise formation of the wiring 3.

The foregoing method of manufacturing the layered chip package further makes it possible to prevent a reduction in production efficiency and to prevent the occurrence of defects of the layered chip package. This will now be described in detail.

When a plurality of block assemblies 130 are arranged in an array, as shown in FIG. 33, there are formed small gaps between the jig 122 and the block assemblies 130. The gaps result from the shapes and layout of the jig 122 and the blocks 121 included in the block assemblies 130. Here, a case will be considered where a resin layer is formed by applying an uncured fluid resin and then curing the resin. In such a case, the fluid resin enters the gaps between the jig 122 and the block assemblies 130. The resin entering the gaps adheres to the outer surfaces (the surfaces to become the top surface 2a, the bottom surface 2b and the side surfaces 2d, 2e and 2f of the main body 2) of the plurality of pre-separation main bodies 2P included in the block assemblies 130 other than the pre-wiring surfaces 2Pc, and thereby forms an unwanted resin layer. If such a resin layer covers the plurality of electrodes 32 (terminals 4 and 5) that are exposed at the outer surfaces of the pre-separation main bodies 2P, it becomes necessary to remove the resin layer. This causes a reduction in production efficiency. If the resin layer is not removed, the terminals 4 and 5 become unusable. This results in defects of the layered chip package.

In the foregoing manufacturing method for the layered chip package, in contrast, the resin layer 133 is formed using a resin film. Since the resin film is not fluid, it hardly enters the gaps between the jig 122 and the block assemblies 130. This manufacturing method therefore prevents the formation of the unwanted resin layer mentioned above. Consequently, according to this manufacturing method, it is possible to prevent a reduction in production efficiency and to prevent the occurrence of defects of the layered chip package.

FIG. 33 depicts the resin layer 133 as if it adheres to the outer surfaces of the plurality of pre-separation main bodies 2P included in the block assemblies 130 other than the pre-wiring surfaces 2Pc. However, since the top surface 122a of the jig 122 is slightly lower in level than the top surfaces 130a of the block assemblies 130, the contact area between the resin layer 133 and the block assemblies 130 after flattening the top surface of the resin layer 133 and the top surfaces 130a of the block assemblies 130 is very small as shown in FIG. 34. Consequently, it is easier to remove the resin layer 133 from the outer surfaces of the pre-separation main bodies 2P than in the case where the above-mentioned unwanted resin layer is formed.

In the present embodiment, the step of forming a plurality of blocks 121 includes the steps of: fabricating a plurality of substructures 110; fabricating a first layered substructure 115 by stacking the plurality of substructures 110, the first layered substructure 115 including an array of a plurality of pre-separation main bodies 2P; fabricating a second layered substructure 120 by stacking a plurality of first layered substructures 115 and bonding every two adjacent first layered substructures 115 to each other; and cutting the second layered substructure 120 into the plurality of blocks 121. Here, each of the plurality of blocks 121 includes, as a plurality of main-body-forming portions, a plurality of pre-separation main bodies 2P that are arranged in each of the direction of stacking of the substructures 110 and a direction orthogonal thereto. In the present invention, however, a plurality of blocks 121 may also be obtained by cutting the first layered substructure 115. In this case, each of the plurality of blocks 121 includes, as a plurality of main-body-forming portions, a plurality of pre-separation main bodies 2P that are arranged in the direction orthogonal to the direction of stacking of the substructures 110.

According to the present embodiment, it is possible to simultaneously form a plurality of sets of the terminals 4 and 5 corresponding to a plurality of layered chip packages in the step of fabricating the first layered substructure 115. The manufacturing method consequently makes it possible to mass-produce, at low cost in a short time, layered chip packages that are capable of being electrically connected to each other easily.

According to the present embodiment, it is possible to reduce the number of steps and consequently reduce the cost for the layered chip package, as compared with the manufacturing method for a layered chip package disclosed in U.S. Pat. No. 5,953,588.

In the present embodiment, the first layered substructure 115 is fabricated by the method described with reference to FIG. 22 to FIG. 25. This makes it possible to easily reduce the thickness of a plurality of substructures 110 that constitute the first layered substructure 115 while preventing damage to the substructures 110. The present embodiment thus allows high-yield manufacture of a layered chip package that achieves a reduction in size and a high level of integration.

In the present embodiment, the first layered substructure 115 can be fabricated by a method other than that described with reference to FIG. 22 to FIG. 25. For example, the first layered substructure 115 may be fabricated by bonding two pre-polishing substructures 109 to each other with their respective first surfaces 109a arranged to face each other, polishing the two second surfaces 109b of the two pre-polishing substructures 109 to fabricate a stack including two substructures 110, and laminating a plurality of such stacks. Alternatively, the first layered substructure 115 may be fabricated by bonding two substructures 110 to each other with their respective second surfaces 110b arranged to face each other to thereby fabricate a stack including the two substructures 110, and laminating a plurality of such stacks.

The present invention is not limited to the foregoing embodiment, and various modifications may be made thereto. For example, in the foregoing embodiment, a plurality of blocks 121 are arranged to form a block assembly 130, and a plurality of block assemblies 130 are further arranged to form the wiring 3 on all the pre-separation main bodies 2P included in the plurality of block assemblies 130 simultaneously. However, the wiring 3 may be simultaneously formed on all pre-separation main bodies 2P included in a single block assembly 130, or all pre-separation main bodies 2P included in a single block 121.

After the plurality of pre-separation main bodies 2P each provided with the wiring 3 are separated from each other into a plurality of main bodies 2, additional wiring may be formed on the main bodies 2.

In addition, a photoresist layer of positive type may be used in the step of exposing the photoresist layer to light for forming the frame 108 to be used to form the plurality of electrodes 32. In such a case, the light transmitting areas and the light blocking areas of the mask are inverted as compared with the case of using a photoresist layer of negative type.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A method of manufacturing a plurality of layered chip packages, each of the layered chip packages comprising:
    a main body having a top surface, a bottom surface, and four side surfaces; and
    wiring disposed on at least one of the side surfaces of the main body, wherein:
    the main body includes a plurality of layer portions stacked;
    each of the plurality of layer portions includes a semiconductor chip;
    at least one of the plurality of layer portions further includes a plurality of electrodes that are electrically connected to the semiconductor chip and that each have an end face located in the at least one of the side surfaces of the main body on which the wiring is disposed; and
    the wiring is electrically connected to the end faces of the plurality of electrodes,
    the method comprising the steps of:
    forming a plurality of structures each of which includes at least one main-body-forming portion, the main-body-forming portion being intended to be the main body and having a pre-wiring surface on which the wiring is to be formed later;
    surrounding the plurality of structures with a jig and thereby aligning the structures so that the respective pre-wiring surfaces face upward, the jig having a top surface that is lower in level than the pre-wiring surfaces;
    forming a resin layer using a resin film, the resin layer covering the jig and the plurality of structures;
    polishing the resin layer until the pre-wiring surfaces are exposed and thereby flattening the pre-wiring surfaces and a top surface of a portion of the resin layer that remains on the top surface of the jig;
    forming the wiring on the pre-wiring surfaces of a plurality of main-body-forming portions included in the plurality of structures simultaneously, the step of forming the wiring being performed after the step of flattening; and
    separating the plurality of main-body-forming portions with the wiring formed on the respective pre-wiring surfaces from each other so as to form the plurality of layered chip packages.

2. The method of manufacturing the layered chip packages according to claim 1, wherein each of the structures includes a plurality of main-body-forming portions.

3. The method of manufacturing the layered chip packages according to claim 2, wherein the step of forming the plurality of structures includes the steps of:
    fabricating a plurality of substructures each of which includes an array of a plurality of preliminary layer portions, each of the preliminary layer portions being intended to become any one of the layer portions included in the main body, the substructures being intended to be cut later at a position of a boundary between every adjacent preliminary layer portions;
    fabricating a layered substructure by stacking the plurality of substructures, the layered substructure including an array of a plurality of pre-separation main bodies that are intended to be separated from each other later into individual main bodies; and
    cutting the layered substructure so as to form the plurality of structures.

4. The method of manufacturing the layered chip packages according to claim 3, wherein each of the plurality of structures includes, as the plurality of main-body-forming portions, a plurality of pre-separation main bodies that are arranged in a direction orthogonal to a direction of stacking of the substructures.

5. The method of manufacturing the layered chip packages according to claim 3, wherein each of the plurality of structures includes, as the plurality of main-body-forming portions, a plurality of pre-separation main bodies that are arranged in each of a direction of stacking of the substructures and a direction orthogonal thereto.

6. The method of manufacturing the layered chip packages according to claim 1, wherein the step of aligning the plurality of structures arranges a plurality of assemblies each of which includes the plurality of structures, the assemblies being partitioned from each other by the jig.

* * * * *